US007505324B2

(12) United States Patent
Umezawa et al.

(10) Patent No.: US 7,505,324 B2
(45) Date of Patent: *Mar. 17, 2009

(54) SEMICONDUCTOR MEMORY DEVICE WITH A STACKED GATE INCLUDING A FLOATING GATE AND A CONTROL GATE

(75) Inventors: Akira Umezawa, Tokyo (JP); Kazuhiko Kakizoe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 107 days.

This patent is subject to a terminal disclaimer.

(21) Appl. No.: 11/533,051

(22) Filed: Sep. 19, 2006

(65) Prior Publication Data

US 2007/0020852 A1    Jan. 25, 2007

Related U.S. Application Data

(63) Continuation of application No. 11/016,804, filed on Dec. 21, 2004, now Pat. No. 7,120,057.

(30) Foreign Application Priority Data

Dec. 22, 2003    (JP)    ............... 2003-424327

(51) Int. Cl.
*G11C 16/04*    (2006.01)
(52) U.S. Cl. .................. 365/185.18; 365/175
(58) Field of Classification Search ................
365/185.17–185.18, 185.22, 171, 175, 177;
257/296, 314–316, 330, 335–336, 288, E27.009,
257/E27.133, E29.027, E29.16, E29.256
See application file for complete search history.

(56) References Cited

U.S. PATENT DOCUMENTS 5,497,345 A * 3/1996 Cappelletti ............. 365/185.28

(Continued)

FOREIGN PATENT DOCUMENTS

JP    2000-332202    11/2000

OTHER PUBLICATIONS

Tomasz Brozek, "Effect of Device Type and Plasma Process on the Oxide Thickness Dependence of Plasma-Induced Charging Damage", International Symposium on Plasma Process-Induced Damage, 1998, pp. 46-49.

Barry P. Linder, et al., "Calculating Plasma Damage as a Function of Gate Oxide Thickness", International Symposium on Plasma Process-Induced Damage, 1998, pp. 42-45.

(Continued)

*Primary Examiner*—David Lam
(74) *Attorney, Agent, or Firm*—Oblon, Spivak, McClelland, Maier & Neustadt, P.C.

(57)    ABSTRACT

A semiconductor memory device comprises a first to a fourth semiconductor layer of a first conductivity type which are formed in a fifth semiconductor layer of a second conductivity type in such a manner that they are isolated from one another, memory cells each of which includes a first MOS transistor formed on the first semiconductor layer, a second and a third MOS transistor which are formed on the second and third semiconductor layers, respectively, a first metal wiring layer which connects the gate of the first MOS transistor to the source or drain of at least one of the second and third MOS transistors, and a first contact plug which connects the fourth semiconductor layer to the first metal wiring layer. The first wiring layer is in the lowest layer of the metal wiring lines connected to the gate of the first MOS transistor.

7 Claims, 20 Drawing Sheets

U.S. PATENT DOCUMENTS

| | | | |
|---|---|---|---|
| 5,841,721 A * | 11/1998 | Kwon et al. | 365/218 |
| 6,483,749 B1 | 11/2002 | Choi et al. | |
| 6,590,264 B2 * | 7/2003 | Ker et al. | 257/355 |
| 6,642,588 B1 * | 11/2003 | Porter et al. | 257/393 |
| 7,120,057 B2 * | 10/2006 | Umezawa et al. | 365/185.18 |

OTHER PUBLICATIONS

Wei-Hua Liu, et al., "A 2-Transistor Source-select (2TS) Flash EEPROM for 1.8V-Only Applications", NVSMW 4.1, Feb. 1997, pp. 1-3.

* cited by examiner

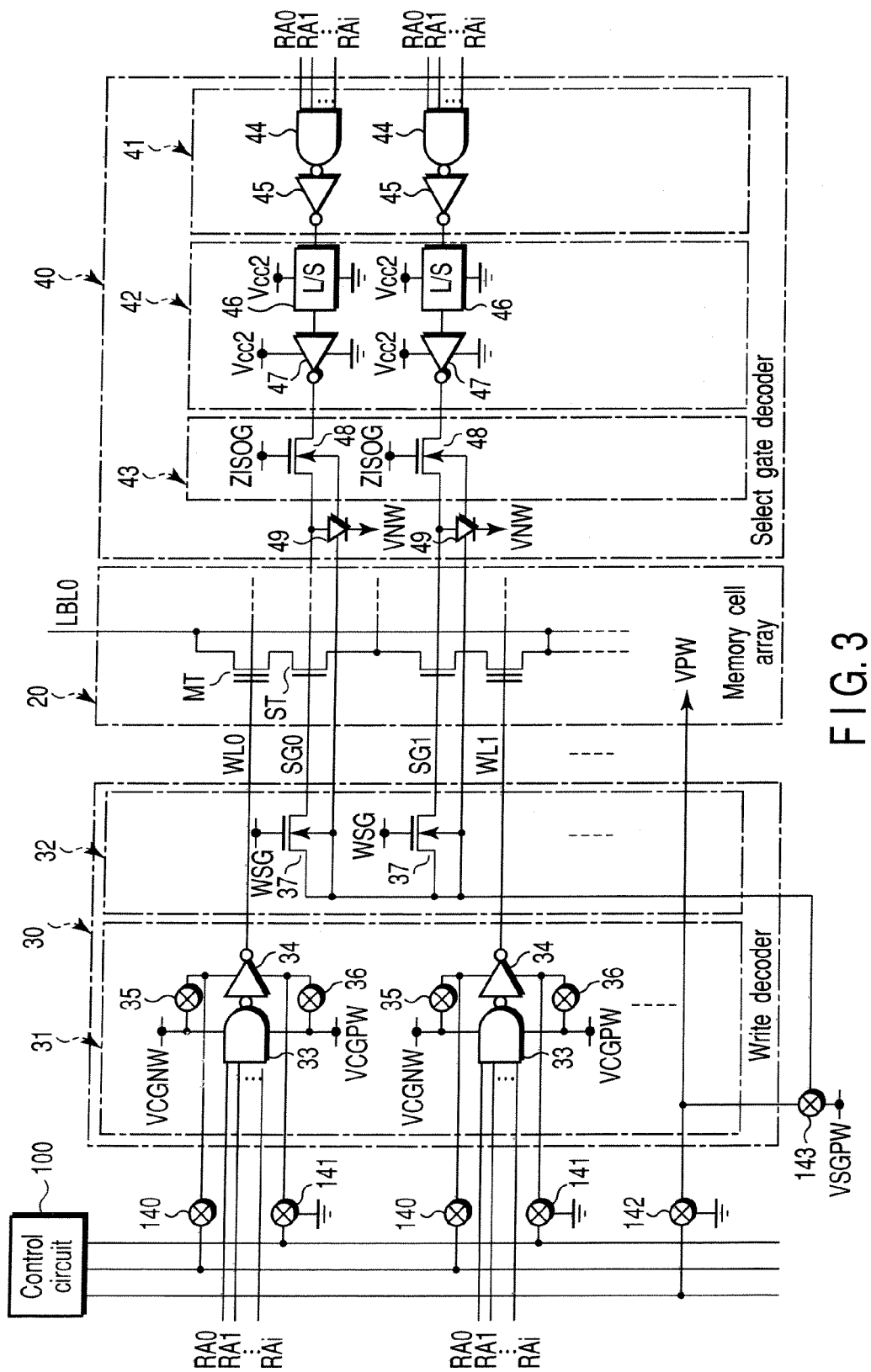
F I G. 3

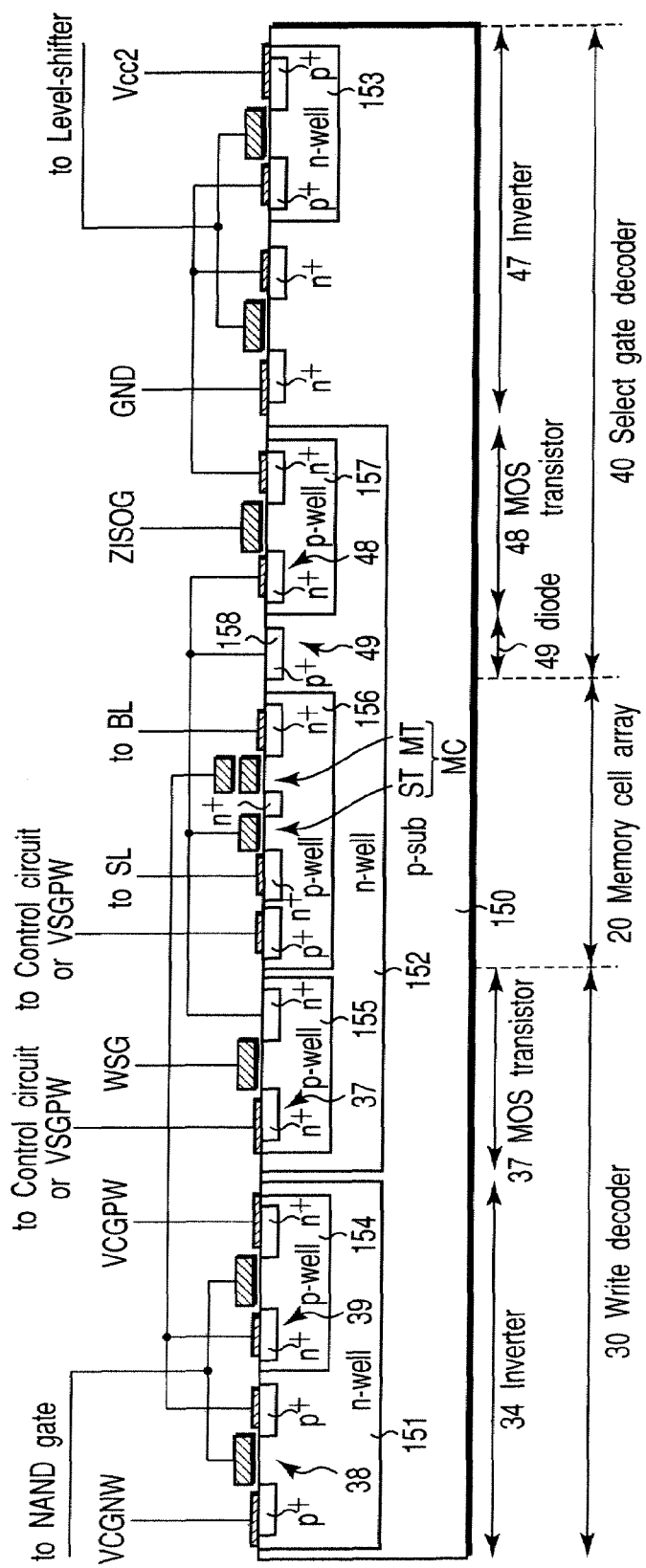
F I G. 5

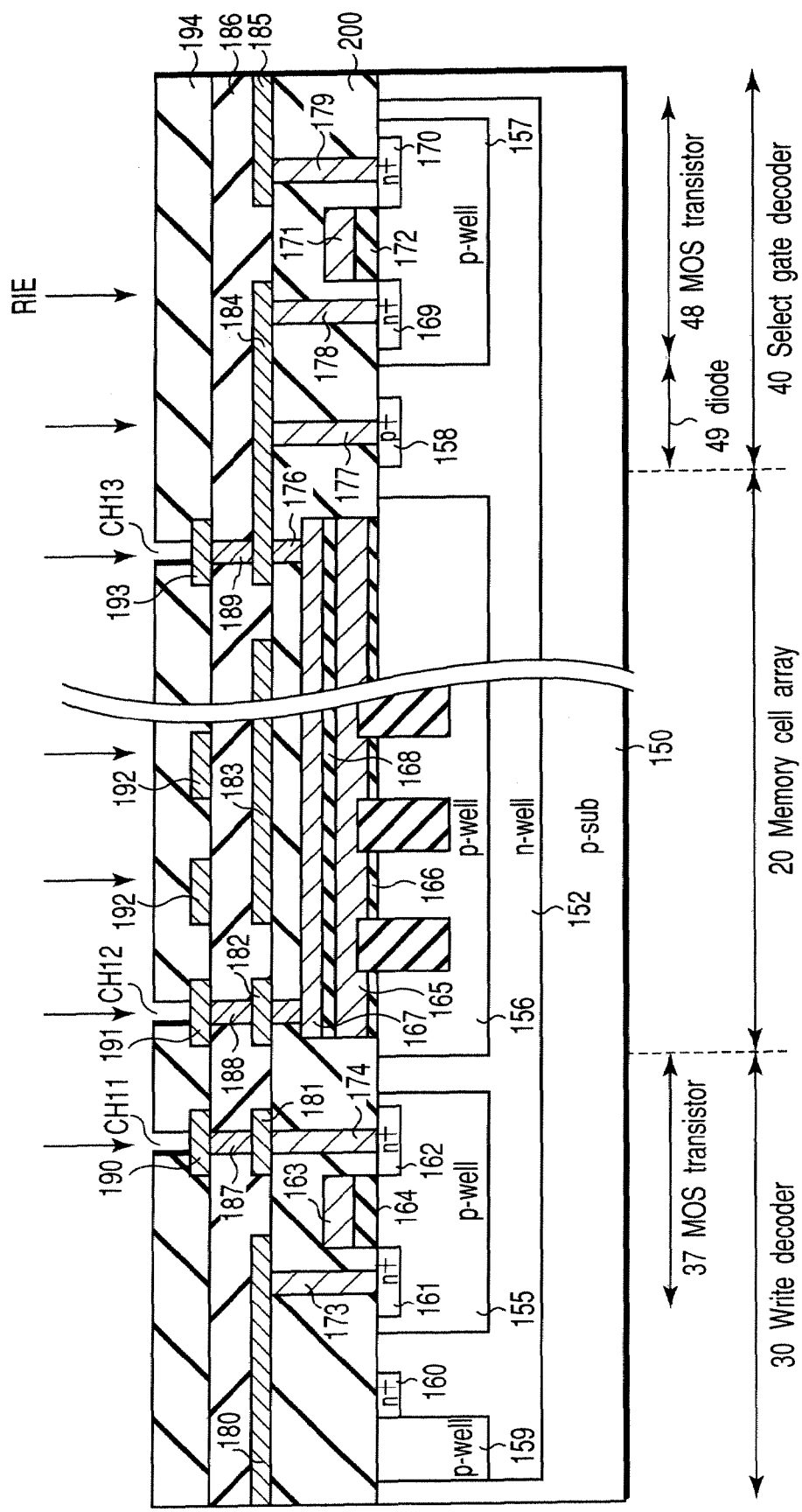
F I G. 13

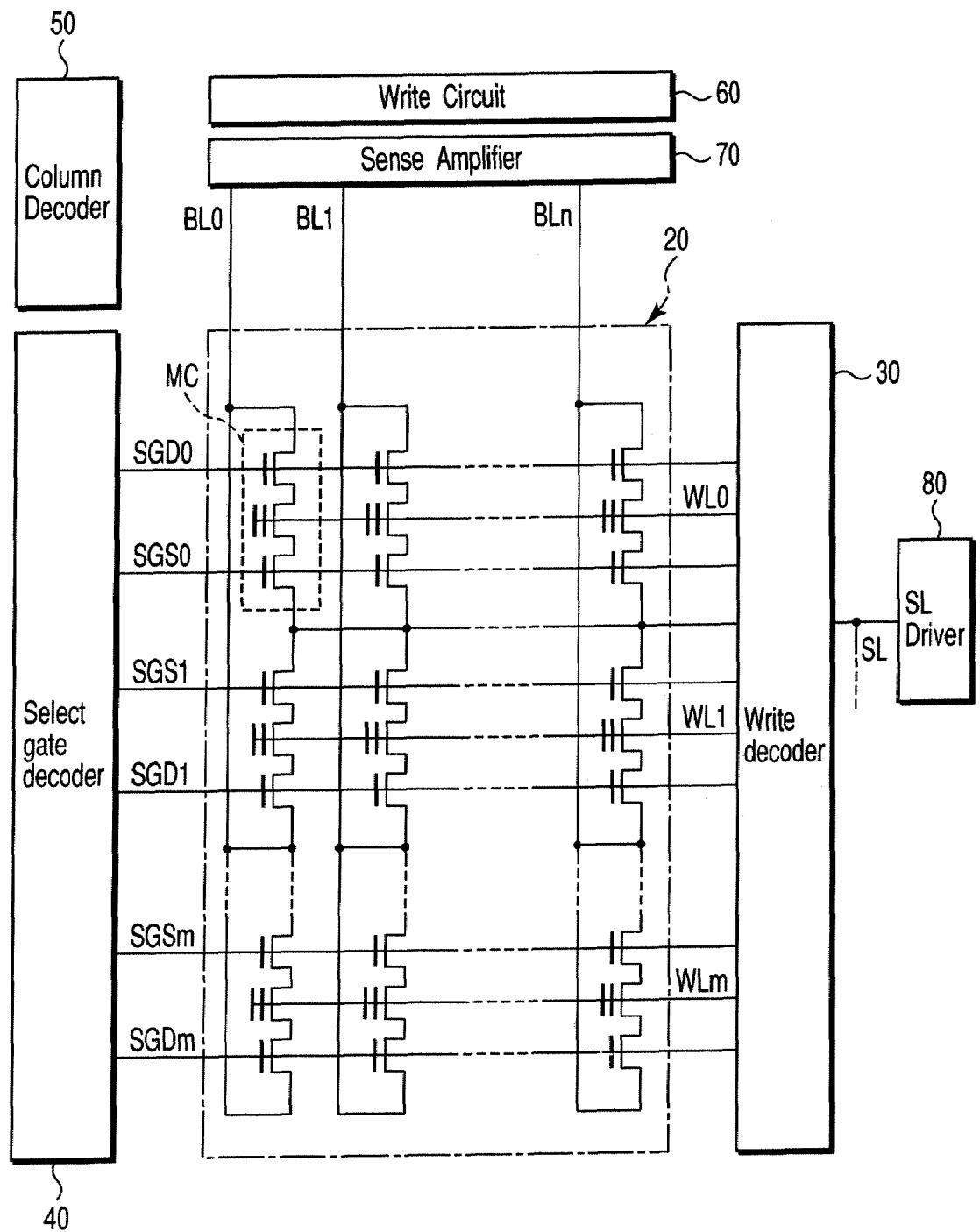
F I G. 20

SEMICONDUCTOR MEMORY DEVICE WITH A STACKED GATE INCLUDING A FLOATING GATE AND A CONTROL GATE

CROSS-REFERENCE TO RELATED APPLICATIONS

This application is a continuation of U.S. patent application Ser. No. 11/016,804, filed Dec. 21, 2004, which is based upon and claims the benefit of priority from prior Japanese Patent Application No. 2003-424327, filed Dec. 22, 2003, the entire contents of each of which are incorporated herein by reference.

BACKGROUND OF THE INVENTION

1. Field of the Invention

This invention relates to a semiconductor memory device. For example, this invention relates to a semiconductor memory device including a MOS transistor having a floating gate and a control gate.

2. Description of the Related Art

With the recent rapid advances in the field of large-scale integrated circuits (LSIs), the affect of plasma damage caused in manufacturing processes on semiconductor elements is becoming more serious. This problem is particularly serious in LSIs using a large number of multilayer wiring lines, because many contact opening processes are carried out.

To overcome this problem, a method of using a protective diode in a one-chip microcomputer having a logic circuit, a semiconductor memory, an MCU, and others embedded to a single chip to cause charges contributive to plasma damage to escape to the semiconductor substrate has been disclosed in, for example, Jpn. Pat. Appln. KOKAI Publication No. 2000-332202.

In recent years, a flash memory combining the features of the NOR flash memory and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell.

As described above, in the conventional LSI, an approach of using a protective diode to avoid plasma damage has been proposed. In the case of LSI with a flash memory including memory cells, each having two MOS transistors as described in the reference, sufficient operating reliability has not been achieved by the conventional method of avoiding plasma damage, because of the use of a positive voltage and a negative voltage in operation and the necessity of guaranteeing that the memory cells can be rewritten more than a hundred thousand times.

BRIEF SUMMARY OF THE INVENTION

A semiconductor memory device according to an aspect of the present invention includes:

a first to a fourth semiconductor layer of a first conductivity type which are formed in a surface region of a fifth semiconductor layer of a second conductivity type in such a manner that they are isolated from one another;

memory cells each of which includes a first MOS transistor of the second conductivity type formed on the first semiconductor layer;

a second and a third MOS transistor of the second conductivity type which are formed on the second and third semiconductor layers, respectively;

a first metal wiring layer which connects the gate of the first MOS transistor to the source or drain of at least one of the second and third MOS transistors and which is in the lowest layer of the metal wiring lines connected to the gate of the first MOS transistor; and a first contact plug which connects the fourth semiconductor layer to the first metal wiring layer.

BRIEF DESCRIPTION OF THE SEVERAL VIEWS OF THE DRAWING

FIG. 3 is a circuit diagram of a part of the memory cell array, select gate decoder, and write decoder included in the flash memory of the first embodiment;

FIG. 5 is a schematic diagram showing a sectional structure of a part of the memory cell array, select gate decoder, and write decoder included in the flash memory of the first embodiment;

FIGS. 7 to 13 are sectional views to help explain a first to a seventh manufacturing process of a flash memory according to the first embodiment;

FIG. 20 is a block diagram of a flash memory according to a third modification of each of the first and second embodiments.

DETAILED DESCRIPTION OF THE INVENTION

Figure 1:
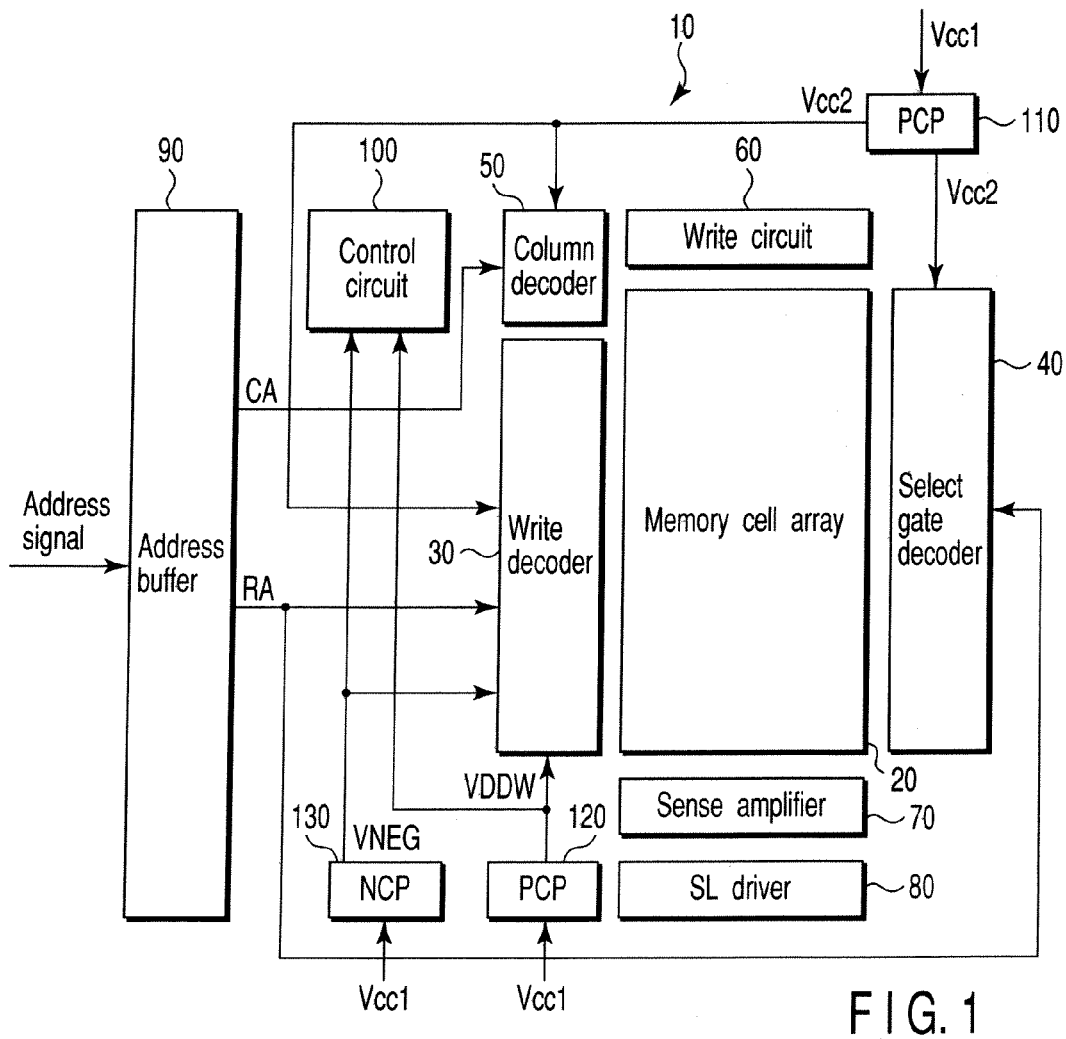
FIG. 1 is a block diagram of a flash memory according to a first embodiment of the present invention.

A semiconductor memory device according to a first embodiment of the present invention will be explained by reference to FIG. 1. FIG. 1 is a block diagram of a flash memory according to the first embodiment.

As shown in FIG. 1, a flash memory 10 comprises a memory cell array 20, a write decoder 30, a select gate decoder 40, a column decoder 50, a write circuit 60, a sense amplifier 70, a source line driver 80, an address buffer 90, a control circuit 100, and boosting circuits 110 to 130.

Figure 2:
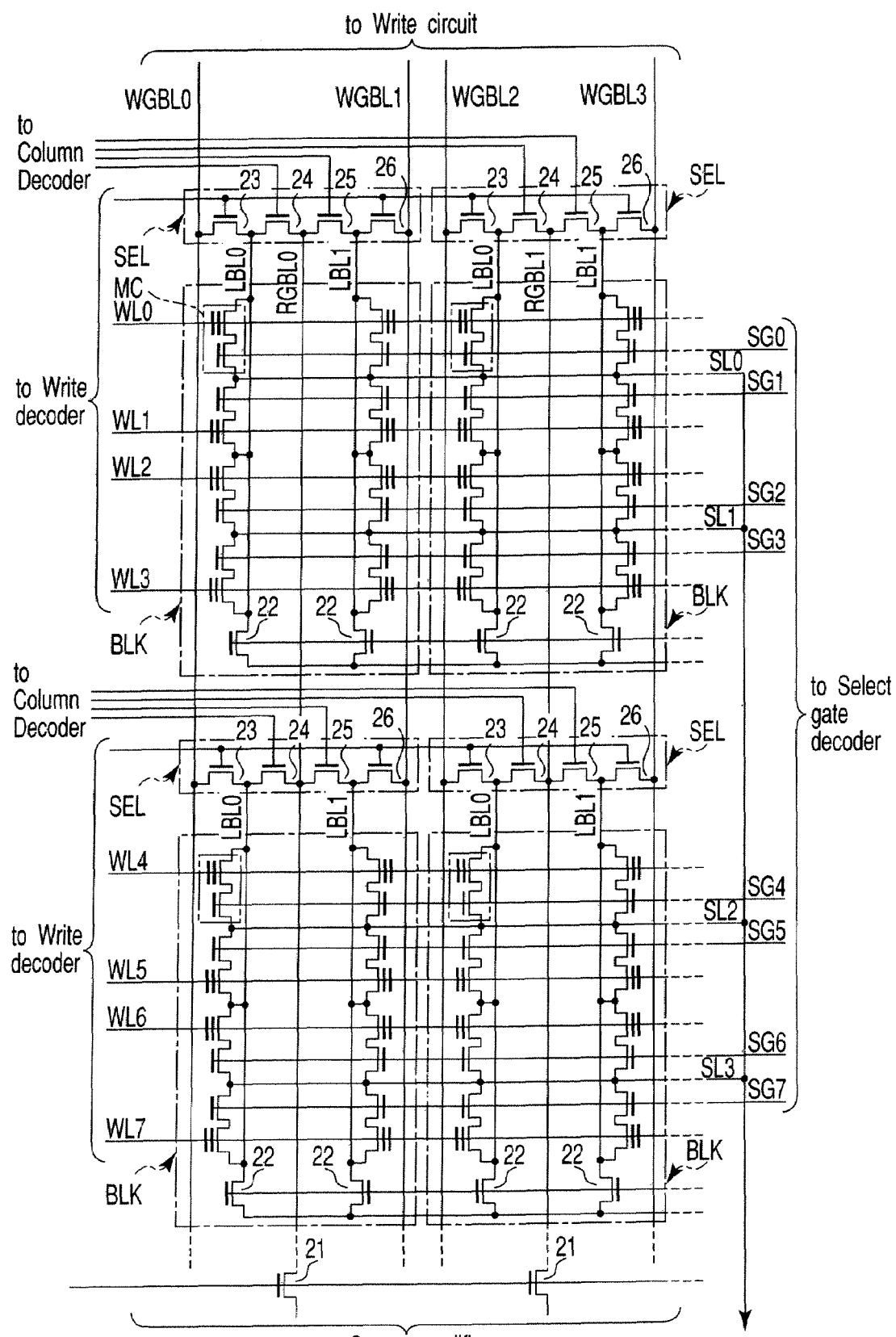
FIG. 2 is a circuit diagram of a memory cell array included in the flash memory of the first embodiment.

The memory cell array 20 has a plurality of memory cells arranged in a matrix. The configuration of the memory cell array 20 will be explained by reference to FIG. 2. FIG. 2 is a circuit diagram of a part of the memory cell array 20.

As shown in FIG. 2, the memory cell array 20 has ((m+1)× (n+1)) memory cell blocks BLKs (m and n are natural numbers), selectors SELs provided for the memory cell blocks BLKs in a one-to-one correspondence, and MOS transistors 21. Although only (2×2) memory cell blocks BLKs are shown in FIG. 2, the number is not restricted to that value.

Each of the memory cell blocks includes a plurality of memory cells MCs. Each of the memory cells MCs includes a memory cell transistor MT and a select transistor ST, which have their current paths connected in series. The memory cell transistor MT has a stacked gate structure that includes a floating gate formed on a semiconductor substrate with a gate insulating film interposed therebetween and a control gate formed on the floating gate with an inter-gate insulating film interposed therebetween. The floating gates are separated on a memory cell transistor MT basis. Like the memory cell transistor MT, the select transistor ST has a stacked gate structure. However, the select transistor ST differs from the memory cell transistor MT in that the floating gates adjoining in the row direction are connected to one another and the floating gate and control gate are connected to each other electrically. Hereinafter, the stacked gates of the select transistors STs are just referred to as the gates. The source region of the memory cell transistor MT is connected to the drain region of the select transistor ST. Each memory cell block includes (4×2) memory cells with the above configuration. Although the number of memory cells arranged in the column direction is 4 in FIG. 1, the number is illustrative and not restrictive and may be 8 or 16, for example. The memory cells MCs adjoining in the column direction share the source region of the select transistor ST or the drain region of the memory cell transistor MT. The drain regions of the memory cell transistors MTs in two columns of memory cells are connected to two local bit lines LBL0, LBL1, respectively. One end of each of the local bit lines LBL0, LBL1 is connected to the selector SEL and the other ends are connected to the write decoder 30 via the current paths of the MOS transistors 22. In the memory cell array 20, the control gates of the memory cell transistors MTs in a same row are connected commonly to any one of word lines WL0 to WL(4m−1). The gates of the select transistors STs in a same row are connected commonly to any one of select gate lines SG0 to SG(4m−1). The local bit lines LBL0, LBL1 are connected commonly to the memory cell transistors in each of the memory cell blocks BLKs, whereas the word lines WLs and select gate lines SGs are connected commonly to the memory cell transistors and select transistors in a same row across the memory cell blocks. The word lines WL0 to WL(4m−1) are connected to the write decoder 30 and the select gate lines SG0 to SG(4m−1) are connected to the select gate decoder 40. The source regions of the select transistors STs are connected commonly to a plurality of memory cell blocks BLKs and then are connected to the source line driver 80.

Next, the configuration of the selector SEL will be explained. Each of the selectors SELs includes four MOS transistors 23 to 26 connected in series. Specifically, one end of the current path of the MOS transistor 23 is connected to one end of the current path of the MOS transistor 24. The other end of the current path of the MOS transistor 24 is connected to one end of the MOS transistor 25. The other end of the current path of the MOS transistor 25 is connected to one end of the current path of the MOS transistor 26. The gates of the MOS transistors 23, 26 are connected to the write decoder 30 and the gates of the MOS transistors 24, 25 are connected to the column decoder 50. The local bit line LBL0 of a corresponding memory cell block BLK is connected to the junction node of the MOS transistor 23 and MOS transistor 24. The local bit line LBL1 of a corresponding memory cell block BLK is connected to the junction node of the MOS transistor 25 and MOS transistor 26. Furthermore, the other ends of the MOS transistors 23, 26 of the selector SEL are connected to any one of write global bit lines WGBL0 to WGBL(2n−1). Each of the write global bit lines WGBL0 to WGBL(2n−1) is connected commonly to the other ends of the current paths of the MOS transistors 23 or MOS transistors 26 in a same column. One end of each of the write global bit lines WGBL0 to WGBL(2n−1) is connected to the write circuit 60 provided for each write global bit line. To the junction node of the MOS transistor 24 and MOS transistor 25, read global bit lines RGBL0 to RGBL(n−1) are connected. Each of the read global bit lines RGBL0 to RGBL(n−1) is connected commonly to the junction nodes of the MOS transistors 24 and MOS transistor 25 of the selectors SEL in a same column. One end of each of the read global bit lines RGBL0 to RGBL(n−1) is connected to the sense amplifier 70 via the current path of the corresponding MOS transistor 21. The gates of the individual MOS transistors 21 are connected to one another and then connected to the column decoder 50.

The configuration of the memory cell array 20 can also be explained as follows. In the memory cell array 20, a plurality of memory cells MCs are arranged in a matrix. The control gates of the memory cell transistors MCs in a same row are connected commonly to any one of the word lines WL0 to WL(4m−1). The gates of the select transistors of the memory cells in a same row are connected commonly to any one of the select gate lines SG0 to SG(4m−1). The drains of the memory cell transistors MT of four memory cells MCs connected in series in a same column are connected commonly to any one of the local bit lines LBL0, LBL1. Specifically, the memory cells MCs in the memory cell array 20 are connected to different local bit lines in units of four memory cells MCs arranged in a column. Then, one end of each of the local bit lines in a same row is connected to one another via the MOS transistor 22 and then is connected to the write decoder 30. The other ends of the local bit lines LBL0, LBL1 in a same column are connected commonly to any one of the write global bit lines WGBL0 to WGBL(2n−1) via the MOS transistors 23, 26 respectively and further are connected commonly to any one of the read global bit lines RGBL0 to RGBL(n−1) via the MOS transistors 24, 25. Then, the sources of the select transistors of the memory cells MCs are connected to one another and then are connected to the source line driver 80. In the memory cell array with the above configuration, two columns of four memory cells MCs connected to the same local bit line form a single memory block BLK. The memory cell blocks in a same column are connected to a common write global bit line and a common read global bit line. The memory cell blocks in a different column are connected to a different common write global bit line and a different common read global bit line.

Returning to FIG. 1, the write decoder 30 selects any one of the word lines WL0 to WL(4m−1) in a write operation and supplies a voltage to the selected word line. It also supplies a voltage to the gates of the MOS transistors 23, 26 in the selector SEL. Furthermore, It supplies a voltage to the gate of the MOS transistor 22 and the common junction node of the local bit lines.

The select gate decoder 40 selects any one of the select gate lines SG0 to SG(4m−1) and supplies a voltage to the selected select gate line.

The details of the write decoder 30 and select gate decoder will be explained later.

The column decoder 50 selects any one of the MOS transistors 24, 25 in the selector SEL in a read operation and supplies a voltage to the gate of the selected MOS transistor. Furthermore, it also supplies a voltage to the gate of the MOS transistor 21.

The write circuit 60 latches the write data.

The sense amplifier 70 amplifies the data read out.

The source line driver 80 supplies a voltage to the source line.

The address buffer 90 holds an address signal. Then, the address buffer 90 supplies a column address signal CA to the column decoder 50 and a row address signal RA to the write decoder 30 and select gate decoder 40.

The control circuit 100 supplies a voltage to the write decoder. The details of the control circuit 100 will be explained later.

The boosting circuit 110 generates a positive potential. Specifically, the boosting circuit 110 raises an externally input voltage Vcc1 (1.25 to 1.65V) to an internal voltage Vcc2 (2.5 to 3.6V). Then, the boosting circuit 110 supplies the internal Vcc2 to the write decoder 30, select gate decoder 40, and column decoder 50.

The boosting circuit 120 generates a positive potential. Specifically, on the basis of the externally input voltage Vcc1, the boosting circuit 120 generates an internal voltage VDDW. The internal voltage VDDW is, for example, 0V to Vpp (12V).

The boosting circuit 130 generates a negative potential. Specifically, on the basis of the externally input voltage Vcc1, the boosting circuit 130 generates an internal voltage VNEG. The internal voltage VNEG is, for example, 0V to VBB (−8V).

Next, the details of the write decoder 30, select gate decoder 40, and control circuit 100 will be explained by reference to FIG. 3. FIG. 3 is a circuit diagram of a part of the flash memory 10, particularly a detailed circuit diagram of the write decoder 30 and select gate decoder 40.

The configuration of the select gate decoder 40 will be explained. The select gate decoder 40 includes a row address decoding circuit 41, a voltage conversion circuit 42, a switch element group 43, and a diode 49. The row address decoding circuit 41, which operates on a power supply voltage Vcc1 (=1.25 to 1.65V), decodes (i+1)-bit row address signals RA0 to RAi, thereby producing a row address decode signal. The row address decode circuit 41 has NAND circuits 44 and inverters 45 provided for the select gate lines SG0 to SG(4m−1) in a one-to-one correspondence. The NAND circuit 44 performs NAND operation on each bit in the row address signals RA0 to RAi. Then, the inverter 45 inverts the result of the NAND operation and outputs the inverted result as a row address decode signal.

The voltage conversion circuit 42, which operates on a power supply voltage Vcc2 (=2.5 to 3.6V), converts the row address decode signal of the Vcc1 level into that of a Vcc2 level. The power supply voltage Vcc2 is supplied from the boosting circuit 110. The voltage conversion circuit 42 includes level shift circuits 46 and inverters 47 provided for the select gate lines SG0 to SG(4m−1) in a one-to-one correspondence. The level shift circuit 46 converts the voltage level of the row address decode signal into the Vcc2 level. The inverter 47 inverts the output of the level shift circuit 46.

The switch element group 43 has n-channel MOS transistors 48. The MOS transistors 48 are provided for the select gate lines SG0 to SG(4m−1) in a one-to-one correspondence. The output of the inverter 47 is supplied to the select gate lines SG0 to SG(4m−1) via the current path of the corresponding n-channel MOS transistor. A control signal ZISOG is input to the gate of the n-channel MOS transistor 48.

The diodes 49 are provided for the select gate lines in a one-to-one correspondence. The anode of the diode 49 is connected to the junction node of the select gate line and the n-channel MOS transistor 48. The cathode of the diode 49 is connected to an n-well region (explained later).

Next, the configuration of the write decoder 30 will be explained. The write decoder 30 includes a row address decoding circuit 31 and a switch element group 32. The row address decoding circuit 31 decodes (i+1)-bit row address signals RA0 to RAi, thereby producing a row address decode signal. The row address decode signal is supplied to the word lines WL0 to WL(4m−1). The row address decoding circuit 31 has NAND circuits 33 and inverters 34 provided for the word lines WL0 to WL(4m−1) in a one-to-one correspondence. The NAND circuit 33 has its positive power supply voltage node connected to a power supply voltage node VCGNW and its negative power supply voltage node connected to a power supply voltage node VCGPW. The NAND circuit 33 performs NAND operation on each bit in the row address signals RA0 to RAi. Any one of the voltages VDDW and VNEG generated by the boosting circuits 120, 130 and the voltage Vcc2 generated by the boosting circuit 110 is supplied to the power supply nodes VCGNW, VCGPW. The inverter 34 inverts the result of the NAND operation and outputs the inverted result as a row address decode signal. The positive power supply voltage node of the inverter 34 is connected to the power supply voltage node VCGNW via a switch element 35 and to the control circuit 100 via a switch element 140. The negative power supply voltage node of the inverter 34 is connected to the power supply voltage node VCGPW via a switch 36 and to the control circuit 100 via a switch 141. Thus, the inverter 34 operates on the basis of the voltage at the power supply voltage node VCGNW, VCGPW or the voltage supplied from the control circuit 100.

The switch element group 32 has n-channel MOS transistors 37. The n-channel MOS transistors 37 are provided for the select gate lines SG0 to SG(4m−1) in a one-to-one correspondence. One end of the current path of each of the n-channel MOS transistors 37 is connected to the corresponding one of the select gate lines SG0 to SG(4m−1). The other end of the current path is connected via a switch element 143 to the power supply voltage node VSGPW or the well potential VPW of the well region in which the memory cell array 20 is formed. A control signal WSG is input to the gate of the n-channel MOS transistor 37. The back gate potential (the potential of the well region) of the n-channel MOS transistor 38 is set to the same potential as that of the other end of the current path and as that of the back gate potential of the n-channel MOS transistor 48.

As described above, the control circuit 100 is connected to the power supply node (positive or negative) of the inverter 34. In addition, the control circuit 100 is connected to the well potential VPW of the memory cell array 20.

Figure 4:
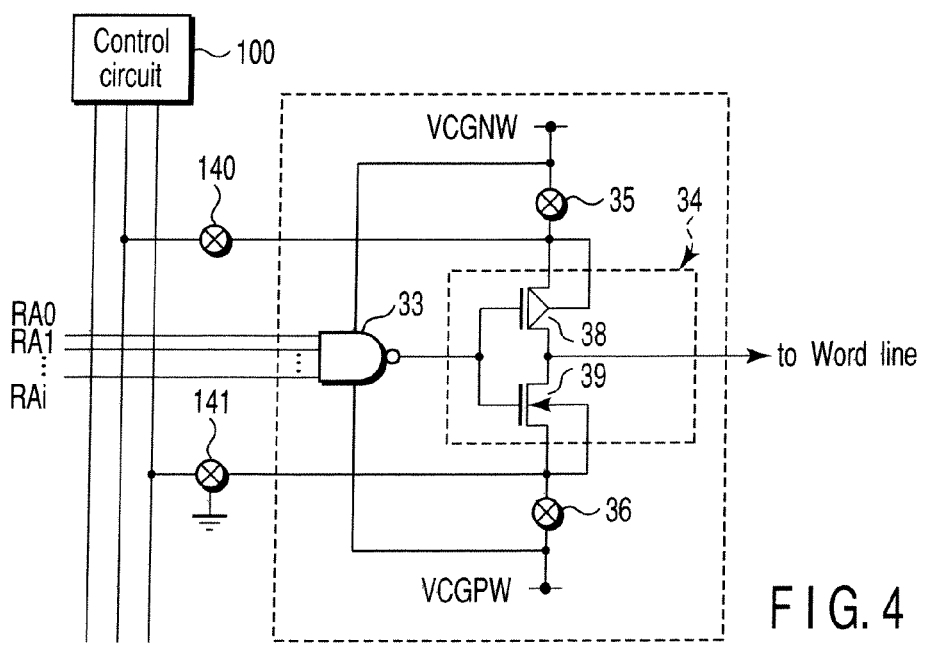
FIG. 4 is a circuit diagram of the row address decoding circuit in FIG. 3.

The details of the configuration of the row address decoding circuit 31 in the write decoder 30 will be explained by reference to FIG. 4. FIG. 4 is a circuit diagram of the row address decoding circuit.

As shown in FIG. 4, the inverter 34 includes a p-channel MOS transistor 38 and an n-channel MOS transistor 39. The source of the p-channel MOS transistor is connected to the back gate and to the VCGNW node via the switch element 35 and further to the control circuit 100 via a switch element 140. The drain of the n-channel MOS transistor 39 is connected to the drain of the p-channel MOS transistor 38. The source of the n-channel MOS transistor is connected to the back gate and to the VCGPW node via the switch element 36 and further to the control circuit 100 via a switch element 141. Then, the gates of the p-channel MOS transistor 38 and n-channel MOS transistor 39 are connected to each other and are then connected to the output node of the NAND gate 33. Furthermore, the junction node of the drain of the p-channel MOS transistor 38 and the drain of the n-channel MOS transistor 39 is connected to the corresponding word line.

FIG. 5 is a schematic sectional view of a part of the memory cell array 20, select gate decoder 40, and write decoder 30 in FIG. 3. FIG. 5 particularly shows only a single memory cell MC, inverters 34, 47, a diode 49, and MOS transistors 37, 48.

As shown in FIG. 5, at the surface of a semiconductor substrate 150, n-well regions 151 to 153 are formed in such a manner that they are separated from one another. The n-well region 151 is for forming an inverter 34 in the write decoder 30. The n-well region 152 is for forming a p-channel MOS transistor 37 in the write decoder 34, a memory cell MC in the memory cell array 20, and a p-channel MOS transistor 48 in the select gate decoder 40. The n-well region 153 is for forming an inverter 47 in the select gate decoder 40.

A p-well region 154 is further formed in the surface of the n-well region 151. Then, the p-channel MOS transistors 38, 39 included in the inverter 34 are formed on the n-well region 151 and p-well region 154. The p-well region 151 is connected to a VCGNW node and the p-well region 154 is connected to a VCGPW node.

At the surface of the n-well region 152, p-well regions 155 to 157 are further formed. Then, the MOS transistor 37 in the write decoder 34, the memory cell MC, and the MOS transistor 48 in the select gate decoder 40 are formed on the p-well regions 155 to 157. Although the select transistor ST of the memory cell is illustrated as a single-layer gate, it may have a stacked gate structure as does the memory cell transmission MT. The p-well regions 155, 156 are connected to the control circuit 100 or a VSGPW node. As described above, the p-well region 157 is set to the same potential as that of the p-well region 155. A p$^+$-type impurity diffused layer 158 is formed in the surface of the n-well region 152. The p$^+$-type impurity diffused layer 158, together with the n-well region 152, forms a diode 49.

A p-channel MOS transistor in the inverter 47 is formed on the n-well region 153. In addition, an n-channel MOS transistor in the inverter 47 is formed on the p-type semiconductor substrate 150. Then, the voltage Vcc2 is supplied to the n-well region 153.

Figure 6:
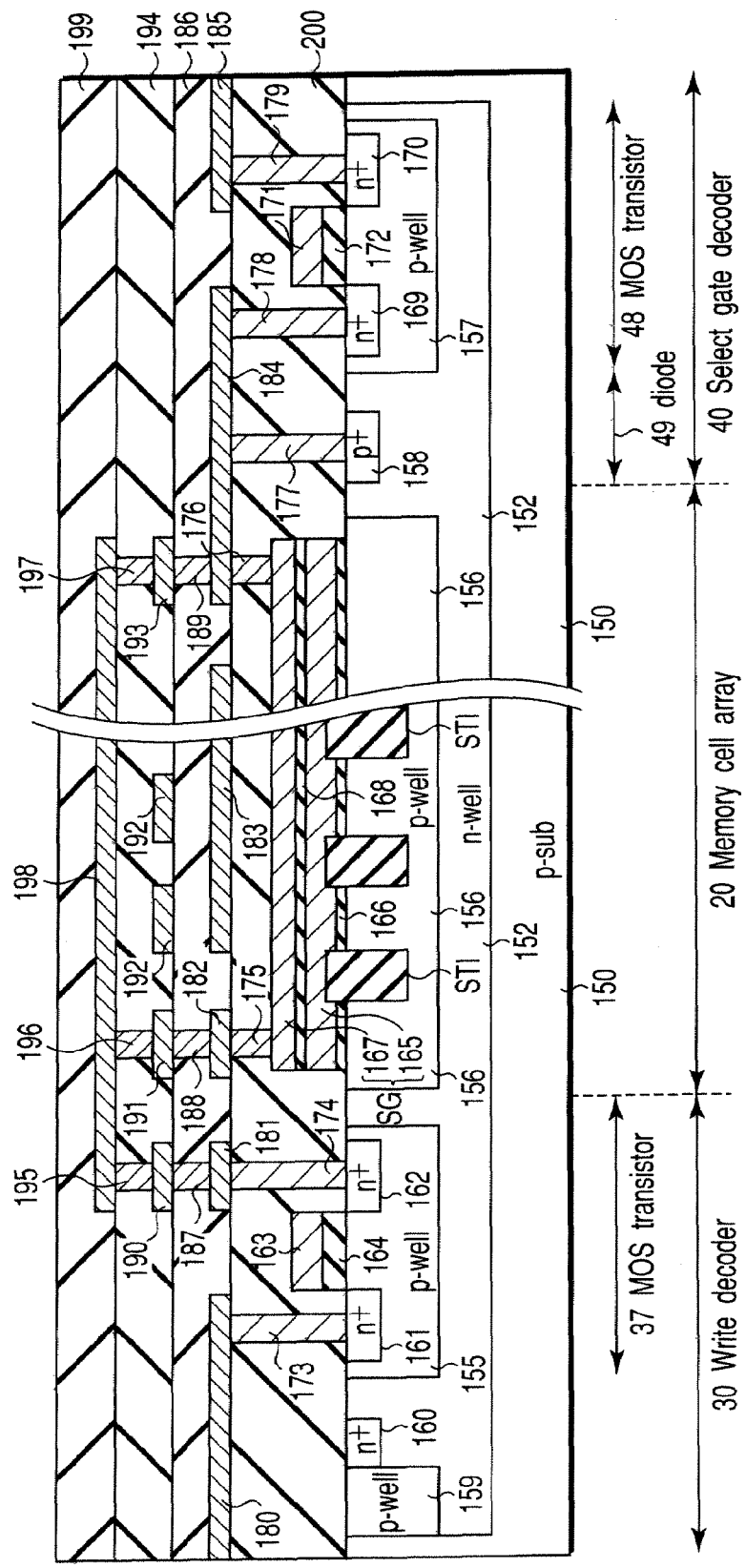
FIG. 6 is a sectional view of a part of the memory cell array, select gate decoder, and write decoder included in the flash memory of the first embodiment.

FIG. 6 is a more concrete sectional view of the MOS transistor 155, memory cell MC, diode 49, and MOS transistor 48 formed on the n-well region 152. In the memory cell MC, only the select transistor ST is shown.

As shown in FIG. 6, a p-well region 159 and an n$^+$-type impurity diffused layer 160 are formed at the surface of the n-well region 152, in addition to the p-well regions 155 to 157 and p$^+$-type impurity diffused layer 158. The p$^+$-type impurity diffused layer 158, which has a higher impurity concentration than that of the p-well regions 155 to 157, functions as the anode region of the diode 49. Then, the n-well region 152 functions as the cathode region, thereby forming the diode 49. The n$^+$-type impurity diffused layer 160, which has a higher impurity concentration than that of the n-well region 152, is in contact with the p-well region 159. That is, the n$^+$-type impurity diffused layer 160 and p-well region 159 form a diode. The p-well region 159, which is provided at the end of the n-well region 152, is in contact with the p-type semiconductor substrate 150.

N$^+$-type impurity diffused layers 161, 162 are formed at the surface of the p-well region 155 in such a manner that they are separated from one another. A gate electrode 163 is formed on the p-well region 155 between the n$^+$-type impurity diffused layers 161, 162 with a gate insulating film 164 interposed there-between. The n$^+$-type impurity diffused layers 161, 162 and gate electrode 163 form the MOS transistor 37.

A plurality of element isolating regions STI is formed in the p-well region 156. The element isolating regions STI are formed so as to have a striped pattern extending in the direction perpendicular to the word lines and select gate lines (or the direction perpendicular to the sheet of paper on which the figure is drawn). In FIG. 6, the memory cell MC is shown in the direction in which the word lines and select gate lines are extended. A polysilicon layer 165 is formed on the p-well region 156 with a gate insulating film 166 interposed therebetween. A polysilicon layer 167 is formed on the polysilicon layer 165 with an inter-gate insulating film 168 interposed therebetween. In the select transistor ST, the polysilicon layers 165, 167, which are connected to each other electrically, both function as a select gate line SG. In the memory cell transistor MT, the polysilicon layers 165, 167, which are separated from one another electrically, function as a floating gate and a control gate (word line WL), respectively. The floating gates are separated on a memory cell basis. In a region (not shown) of the p-well region 156, the source and drain regions of the memory cell transistor MT and select transistor ST are formed.

N$^+$-type impurity diffused layers 169, 170 are formed in the surface of the p-well region 157 in such a manner that they are isolated from one another. A gate electrode 171 is formed on the p-well region 157 between the n$^+$-type impurity diffused layers 169, 170, with a gate insulating film 172 interposed therebetween. The n$^+$-type impurity diffused layers 169, 170 and gate electrode 171 form the MOS transistor 48.

The film thickness of the gate insulating films 166 of the memory cell transistor MT and select transistor ST is, for example, 8 nm. The film thickness of the gate insulating films 164, 172 of the MOS transistors 37, 48 is, for example, about 18 nm.

An interlayer insulating film 200 is formed on the p-type semiconductor substrate 150, so as to cover the MOS transistors 37, 48, memory cell MC, and diode 49. Contact plugs 173 to 179 are formed in the interlayer insulating film 200. The contact plugs 173, 174 are connected to the n$^+$-type impurity diffused layers 161, 162, respectively. The contact plugs 175, 176 are connected to one end (or the write decoder 30 side) of the select gate line (polysilicon layer) 167 and the other end (or the select gate decoder 40 side). The contact plug 177 is connected to the p$^+$-type impurity diffused layer 158. The contact plugs 178, 179 are connected to the n$^+$-type impurity diffused layers 169, 170, respectively.

Metal wiring layers 180 to 185 of a first layer (the lowest layer) are formed on the interlayer insulating film 200. The metal wiring layer 180 connects the contact plug 173 to the control circuit 100 or to the VSGPW node. The metal wiring layers 181, 182 are connected to the contact plugs 174, 175, respectively. The metal wiring layer 183, which functions as a source line SL, is formed into a stripe pattern extending along the word line WL and is connected commonly to the source regions of the select transistors ST. The metal wiring layer 184, which connects the select gate line SG to the select gate decoder 40, are connected to the contact plugs 176, 177, 178. The metal wiring layer 185 connects the contact plug 179 to the inverter 47. An interlayer insulating film 186 is formed on the interlayer insulating film 200, so as to cover the metal wiring layer. Contact plugs 187 to 189 are formed in the interlayer insulating film 186. The contact plugs 187 to 189 are connected to the metal wiring layers 181, 182, 184, respectively.

Metal wiring layers 190 to 193 of a second layer are formed on the interlayer insulating film 186. The metal wiring layers 190, 191 are connected to the contact plugs 187, 188, respectively. The metal wiring layer 192, which functions as local bit lines LBL0, LBL1, is formed into a stripe pattern perpendicular to the word line and connects commonly the drain regions of the memory cell transistors in a same column. The metal wiring layer 193 is connected to the contact plug 189. An interlayer insulating film 194 is formed on the interlayer insulating film 186, so as to cover the metal wiring layers 190 to 193. Contact plugs 195 to 197 are formed in the interlayer insulating film 194. The contact plugs 195 to 197 are connected to the metal wiring layers 190, 191, 193, respectively.

A metal wiring layer 198 of a third layer is formed on the interlayer insulating film 194. The metal wiring layer 198, which functions as a shunt wire for the select gate line SG, is connected to the contact plugs 195 to 197.

Next, the operation of the flash memory configured as described above will be explained briefly. The details will be explained later.

<Write Operation>

Data is written simultaneously into all of the memory cells connected to any one of the word lines. Either "0" data or "1" data is written, depending on whether electrons are injected into the floating gate of the memory cell transistor MT. Electrons are injected into the floating gate by Fowler-Nordheim (FN) tunneling.

First, in FIG. 1, write data ("1" or "0") is input from an I/O terminal (not shown). Then, the write data is input to the write circuit 60. When "1" data is stored in the write circuit 60, the output of the write circuit 60 is on the high-voltage side, or at 0V. Conversely, when "0" data is stored in the write circuit 60, the output of the write circuit 60 is on the low-voltage side, or at VBB (−8V). These voltages are supplied to the corresponding write global bit line WGBL (see FIG. 2).

Then, the write decoder 30 selects any one of the word lines WL0 to WL(4m−1) and turns off the MOS transistor 22. The write decoder 30 supplies Vpp (e.g. 12V) to the selected word line. The select gate decoder 40 sets the select gate lines SG0 to SG(4m−1) to the low (L) level (VBB). As a result, all of the select transistors are turned off.

Furthermore, the write decoder 30 turns on the MOS transistors 23, 26 in the selector SEL corresponding to the memory cell block BLK including the selected word line. As a result, the write global bit line WGBL and the local bit line LBL are connected to each other electrically, whereas the write decoder 30 turns off the MOS transistors 23, 26 in the selectors SELs corresponding to the memory cell blocks BLKs not including the selected word line. The column decoder 50 turns off the MOS transistors 24, 25 in all of the selectors SEL. As a result, the read global bit line RGBL is separated from the local bit line LBL electrically.

As a result, the potential corresponding to "1" data or "0" data is supplied from the write global bit line to the local bit line LBL of the memory cell block BLK including the selected word line via the MOS transistors 23, 26 in the selector. This potential is supplied to the drain region of the memory cell transistor MT. Then, Vpp (12V) is applied to the selected word line WL, 0V is applied to the drain of the memory cell MC in which "1" data is to be written, and VBB (−8V) is applied to the drain region of the memory cell MC in which "0" data is to be written. Therefore, electrons are not injected into the floating gate in the memory cell in which "1" data is to be written, with the result that the memory cell MC holds a negative threshold value. On the other hand, in the memory cell MC in which "0" data is to be written, electrons are injected into the floating gate by FN tunneling. As a result, the threshold value of the memory cell changes to positive.

<Read Operation>

In a read operation, data can be read simultaneously from a plurality of memory cells connected to any one of the word lines. Data is read from one memory cell MC per block.

First, the select gate decoder 40 selects any one of the select gate lines SG0 to SG(4m−1). A high (H) level (Vcc2) is supplied to the selected select gate line. The unselected gate lines are all at a low (L) level (0V). Thus, the select transistor ST connected to the selected select gate line is turned on, whereas the select transistors ST connected to the unselected select gate lines are tuned off. In addition, the write decoder 30 not only sets all of the word lines WL0 to WL(4m−1) to the low level but also turns off the MOS transistor 22. The source line driver 80 sets the potential of the source line to 0V.

Furthermore, the column decoder 50 turns on any one of the MOS transistors 24, 25 in the selector SEL corresponding to the memory cell block BLK including the selected select gate line. As a result, the read global bit lines RGGLO to RGBL(n−1) are connected to the local bit line LBL0 or LBL1 electrically. The MOS transistors 24, 25 in the selectors SELs corresponding to the memory cell blocks BLKs not including the selected select gate line are turned off. The write decoder 30 turns off the MOS transistors 23, 26 in all of the selectors SELs. As a result, the write global bit line WGBL is separated from the local bit line LBL electrically. The column decoder 50 turns on the MOS transistor.

As a result, the local bit line LBL0 or LBL1 is connected to the sense amplifier 70 via the MOS transistor 24 or MOS transistor 25 in the selector SEL or the read global bit lines RGBL0 to RGBL(n−1).

Then, for example, about 1V is supplied to the read global bit lines RGBL0 to RGBL(n−1). Then, since the memory cell transistor MT in the memory cell MC in which "1" data has been written has a negative threshold voltage, it turns on. Therefore, in the memory cell MC connected to the selected select gate line, current flows from the read global bit line RGBL to the source line SL via the local bit line LBL, memory cell transistor MT, and select transistor ST. On the other hand, since the memory cell transistor MT in the memory cell MC in which "0" data has been written has a positive threshold voltage, it turns off. Thus, no current flows in the read global bit line RGBL.

As described above, the potential on the read global bit line RGBL varies. The variation is amplified by the sense amplifier 70, thereby carrying out the read operation.

<Erase Operation>

The data in all of the memory cells sharing a well region is erased at the same time. Therefore, in the example of FIG. 2, the contents in all the memory cells included in the memory cell array 20 are erased simultaneously.

Specifically, the write decoder 30 sets all of the word lines WL0 to WL(4m−1) to VBB (−8V) and the potential of the semiconductor substrate (well region 156: see FIG. 5) to Vpp (20V). As a result, electrons are pulled out of the floating gates of the memory cell transistors of the memory cells MCs into the well region 156 by FN tunneling. Consequently, the threshold voltages of all of the memory cells MCs become negative, thereby erasing the data.

The above operation will be explained in detail, particularly referring to the write decoder 30 and select gate decoder 40.

<Write Operation>

Before a write operation is started, the voltages VDDW, VNEG generated by the boosting circuits 120, 130 are Vcc2 and 0V, respectively. When the write operation is started, the boosting circuit 120 boosts the generated voltage VDDW of Vcc2 to Vpp (12V). Since VDDW is supplied to the VCGNW node in the write decoder 30, the potential at the VCGNW node also rises to Vpp. Furthermore, the switch elements 35, 36 in the row address decoding circuit 31 turn on. In addition, the switch elements 140, 141 turn off. Thus, the inverter 34 operates using the VCGNW and VCGPW as power supply voltages. The potential at the VCGPW node is always at 0V. Since the output of the NAND gate 33 corresponding to the selected word line is at the low (L) level, the output of the inverter 34 is at VDDW=Vpp (the potential at the VCGNW node). Since the output of the NAND gate 33 corresponding to the unselected word line is at the high (H) level, the output of the inverter 34 is at 0V (the potential at the VCGPW node). As a result, the potential of the selected word line is VCGNW=Vpp and the potential of the unselected word line is VCGPW=0V. Moreover, since the control signal WSG is set at the high (H) level (Vcc2), all of the p-channel MOS transistors 37 are turned on. The control signal ZISOG is set at the low (L) level (0V) in the write operation, which turns off the p-channel MOS transistor 48. As a result, the select gate decoder 30 is separated from the select gate line SG electrically.

When the voltage VDDW has reached Vpp, the boosting circuit 130 boosts the generated voltage VNEG of 0V to VBB (-8V). The switch element 142 is turned on. Then, the control circuit 100 supplies the voltage VNEG generated by the boosting circuit 130 to the p-well region 156 in which the memory cell array 20 has been formed. As a result, the potential VPW of the p-well region 156 becomes VBB. The voltage VNEG is also supplied to the VSGPW node. Then, the switch element 143 connects the VSGPW node to the p-channel MOS transistor 37. As a result, the potentials of the impurity diffused layer of the p-channel MOS transistor 37 and the back gate also become VBB. Then, since the p-channel MOS transistor 37 is on, the potentials of all of the select gate lines SG0 to SG(4m-1) become VNEG=VBB. Thus, the select transistor ST is turned off. At this point in time, the path from the switch element 142 to the memory cell array 20 is separated from the VSGPW node by the switch element 143. That is, although the well potential VPW and the potential of the select gate line are both VBB, VBB is supplied to them by way of different paths.

As described above, Vpp is supplied to the selected word line WL0, 0V is supplied to the unselected word lines, VBB is supplied to all of the select gate lines SG0 to SG(4m-1), and VBB is supplied to the well region 156. In this state, 0V or -8V is applied to the local bit line LBL0, thereby writing data into the memory cell MC connected to the word line WL0.

<Read Operation>

First, a row address signal RA is inputted to the NAND gate 44 of the row address decoding circuit 41. The output of the NAND gate 44 corresponding to the selected select gate line is low (L) and the outputs of the NAND gates 44 corresponding to the unselected select gate lines are high (H). Then, the output of the NAND gate 44 is inverted by the inverter 45. The inverted output is outputted as a row address decode signal of the Vcc1 level. The voltage conversion circuit 42 converts the Vcc1 level of the row address decode signal into the Vcc2 level.

In a read operation, the control signals ZISOG, WSG are set to the high level and low level, respectively. Thus, the MOS transistor 37 is off and the select gate line SG is separated from the write decoder 30 electrically. The MOS transistor 48 is on. Thus, the Vcc2-level signal supplied from the voltage conversion circuit 42 is supplied to the select gate line. That is, Vcc2 is applied to the selected select gate line and 0V is applied to the unselected select gate lines.

All of the word lines are set at 0V.

As described above, the select transistor connected to the selected select gate line is turned on and a voltage is applied to the local bit line, thereby reading the data from the memory cell MC.

The diode 49 is provided between the select gate line and the MOS transistor 48. Since Vcc2 is applied to the selected select gate line, the diode 49 connected to the selected select gate line is forward-biased. Therefore, the potential of the n-well region 152 is also set to Vcc2.

<Erase Operation>

When an erase operation is started, the boosting circuit 120 boosts the generated voltage VDDW of Vcc2 to Vpp. In addition, the switch elements 140, 141 are off. The control circuit 100 supplies the voltage VDDW generated by the step-up circuit 120 to the p-well region 156 in which the memory cell array 20 has been formed. As a result, the potential VPW of the p-well region 156 becomes Vpp.

When the potential VPW has reached Vpp, the boosting circuit 130 boosts the generated voltage VNEG of 0V to VBB (-8V). VNEG supplied from the boosting circuit 130 is supplied to the VCGPW node. Thus, the potential at the VCGPW node also rises to VBB. The potential of the VCGNW node is constantly kept at Vcc2. The switch elements 35, 36 in the row address decoding circuit 31 are on. Thus, the inverter 34 operates using VCGNW (Vcc2) and VCGPW (VBB) as power supply voltages.

In an erase operation, since the outputs of the NAND gates 33 corresponding to all of the word lines WL0 to WL(4m-1) are at the high (H) level, the output of the inverter 34 is at VNEG=VBB (the potential at VCGPW node). As a result, the potential of the word line is at VCGPW=VBB. Since the control signal WSG is set at the low (L) level (0V), all of the p-channel MOS transistors 37 are off. The control signal ZISOG is set at the low (L) level (0V), turning off the p-channel MOS transistor 48. As a result, all of the select gate lines SG0 to SG(4m-1) are in the floating state. At this point in time, the path from the switch element 142 to the memory cell array 20 is separated from the VSGPW node by the switch element 143. The potential at the VSGPW node is always kept at 0V.

In this way, VBB is supplied to all of the word lines WL0 to WL(4m-1), all of the select gate lines SG0 to SG(4m-1) are brought into the floating state, and Vpp is supplied to the well region 156. As a result, electrons pulled out of the floating gates of the memory cell transistors MT, thereby erasing the data.

As described above, the write decoder 30 applies the negative potential VBB to the select gate line SG in a write operation. The select gate decoder applies the positive potential Vcc2 to the select gate line SG in a read operation. Thus, to separate the select gate line SG from the select gate decoder 40 in a write operation, the MOS transistor 48 is provided. To separate the select gate line SG from the write decoder 30 in a read operation, the MOS transistor 37 is provided. A method of writing and reading data can be used as well, including Japanese Patent Application No. 2003-209312 of this reference being incorporated herein by reference.

Next, a method of manufacturing a flash memory with the above configuration will be explained, particularly centering on a region formed on the n-well region 152. FIGS. 7 to 13 are sectional views to help explain the processes of manufacturing a flash memory according to the first embodiment.

Figure 7:
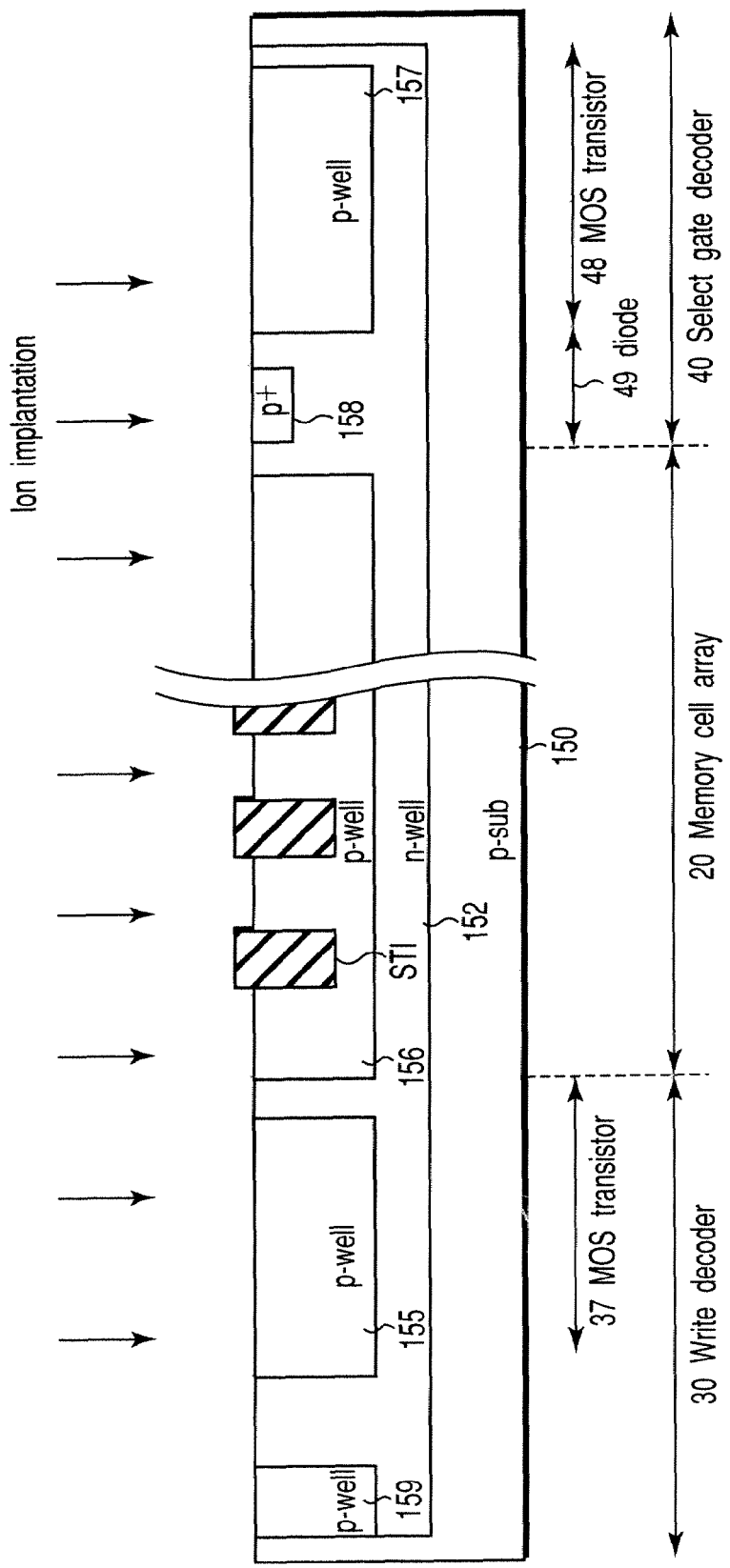

First, as shown in FIG. 7, in a region where the p-type silicon substrate 150, element isolating regions are formed by STI (Shallow Trench Isolation) techniques in a region where the memory cell array 20 is formed. That is, a striped shallow trench is made in the silicon substrate 150. The trench is filled with an insulating film, such as a silicon oxide film.

Next, n-type impurities, such as arsenic or phosphorus, are ion-implanted into the surface region of the silicon substrate 150. Then, p-type impurities, such as gallium or boron, are ion-implanted into the surface region of the silicon substrate 150, followed by a high-temperature heat treatment, which activates the introduced impurities. As a result, the n-well region 152 is formed in the surface region of the silicon substrate 150 and the p-well regions 155 to 157, 159 and $p^+$-type impurity diffused layer 158 are formed in the surface region of the n-well region 152 as shown in FIG. 7. The $p^+$-type impurity diffused layer 158 has to be formed so as to have a higher concentration than that of the p-type well regions 155 to 157. Therefore, the ion implantation process to form the $p^+$-type impurity diffused layer 158 may be carried out separately from the ion implantation process to form the p-type well regions 155 to 157. As described above, the $p^+$-type impurity diffused layer 158, which functions as the anode of the diode 49, combines with the n-well region 152 functioning as the cathode to form the diode 49.

Figure 8:
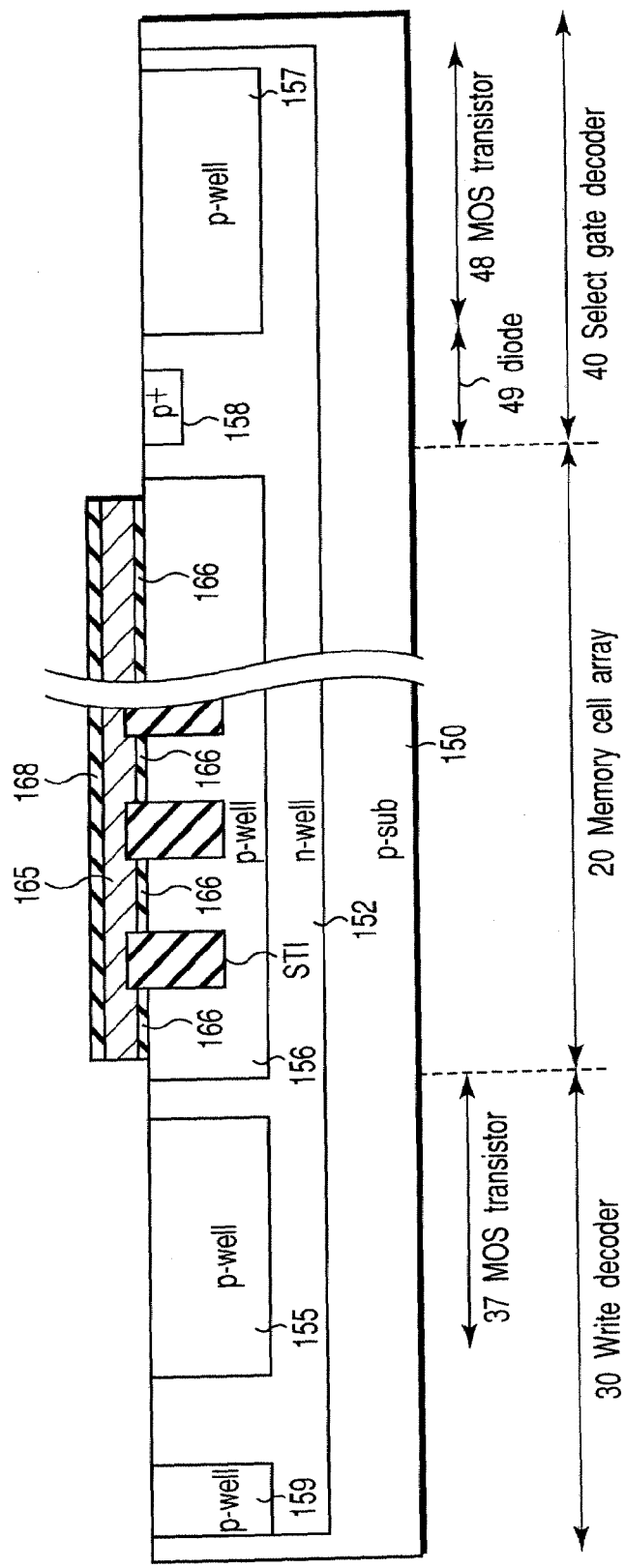

Next, as shown in FIG. 8, the gate insulating film 166 for the memory cell transistor MT and select transistor ST is formed on the silicon substrate 150. The gate insulating film 166 is formed of, for example, a silicon oxide film formed by thermal oxidation techniques. The thickness of the gate insulating film 166 is, for example, 8 nm. Then, an amorphous silicon layer 165 is formed on the gate insulating film 166 to a thickness of, for example, 60 nm. The amorphous silicon layer 165 functions as the floating gate of the memory cell transistor MT and the select gate of the select transistor ST. Thereafter, the amorphous silicon layer 165 is patterned by photolithographic techniques and anisotropic etching, such as RIE (Reactive Ion Etching). Specifically, the amorphous silicon layer 165 is patterned in such a manner that the floating gates are separated between memory cell transistors adjoining in the word line direction in the region where memory cell transistors MT are formed. Then, an ONO film 168 is formed to a thickness of, for example, 15.5 nm on the polysilicon film 165 by, for example, CVD (Chemical Vapor Deposition) techniques. The ONO film 168, which has a multilayer structure of a silicon oxide film, a silicon nitride film, and a silicon oxide film, functions as an inter-gate insulating film for the memory cell transistor MT and select transistor ST. The ONO film may be replaced with an ON film or NO film, a multilayer film of a silicon oxide film and a silicon nitride film. Thereafter, the gate insulating film 166, amorphous silicon layer 165, and ONO film 168 outside the region where the memory cell array 20 is formed are removed by photolithographic techniques and etching, thereby producing the structure shown in FIG. 8.

Figure 9:
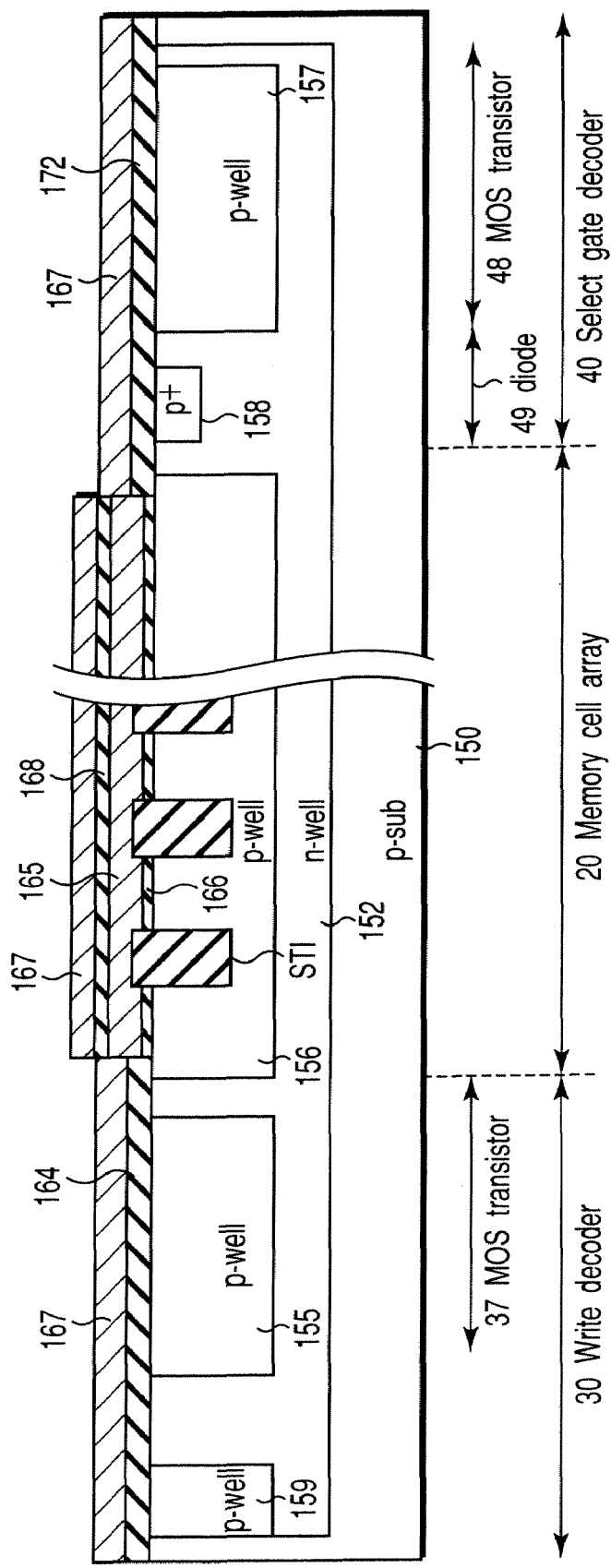

Next, as shown in FIG. 9, with the memory cell array 20 protected by, for example, photoresist, silicon oxide films 164, 172 are formed on the silicon substrate 150 to a thickness of, for example, 18 nm by, for example, thermal oxidation techniques. The silicon oxide films 164, 172 are used as gate insulating films for the MOS transistors 37, 48, respectively. At this time, the gate insulating films of the MOS transistors in the voltage conversion circuit 42 and row address decoding circuit 41 in the select gate decoder 40 and the row address decoding circuit 31 in the write decoder 30 are also formed. The gate insulating film of the MOS transistor in the row address decoding circuit 31, which is formed simultaneously with the MOS transistors 37, 48, has a film thickness of 18 nm. The gate insulating film of the MOS transistor in the voltage conversion circuit 42, which is formed in a process different from the MOS transistors 37, 48, has a film thickness of, for example, 8 nm. The gate insulating film of the MOS transistor in the row address decoding circuit 41, which is also formed in a process different from the MOS transistors 37, 48, has a film thickness of, for example, 3 nm. The reason why the gate insulating films of the MOS transistors in the individual circuits differ in film thickness is that the individual MOS transistors deal with different voltages. The row address decoding circuit 31 and switch element groups 32, 43 deal with relatively high voltage, including the positive voltage Vpp of 12V and the negative voltage VBB of −8V. The voltage conversion circuit 42 deals with the positive voltage Vcc2 of about 2.5 to 3.6V. The row address decoding circuit 41 deals with the positive voltage Vcc1 of about 1.25V to 1.65V. Therefore, a relatively thick gate insulating film of 18 nm in thickness is used for the MOS transistors forming the row address decoding circuit 31 and switch element groups 32, 43. A thin gate insulating film of 3 nm in thickness is used for the MOS transistors forming the row address decoding circuit 41.

Then, as shown in FIG. 9, a polysilicon layer 167 is formed on the inter-gate insulating film 168 and the gate insulating films 164, 172 to a thickness of 40 nm by CVD techniques. The polysilicon layer 167 is used as the control gate of the memory cell transistor MT, the select gate of the select transistor ST, and the gates of the MOS transistors 37, 48. The polysilicon layer 167, which is further formed in a region other than the region shown in FIG. 9, is used as the gates of the MOS transistors forming the voltage conversion circuit 42, row address decoding circuits 41, 31.

Thereafter, a part of the polysilicon layer 167 making a select gate line and the inter-gate insulating film 168 under the part are removed by photolithographic techniques and RIE. Then, the removed region is filled with a polysilicon layer again. As a result, the amorphous silicon layer 165 and polysilicon layer 167 are connected electrically in the select transistor ST.

Figure 10:
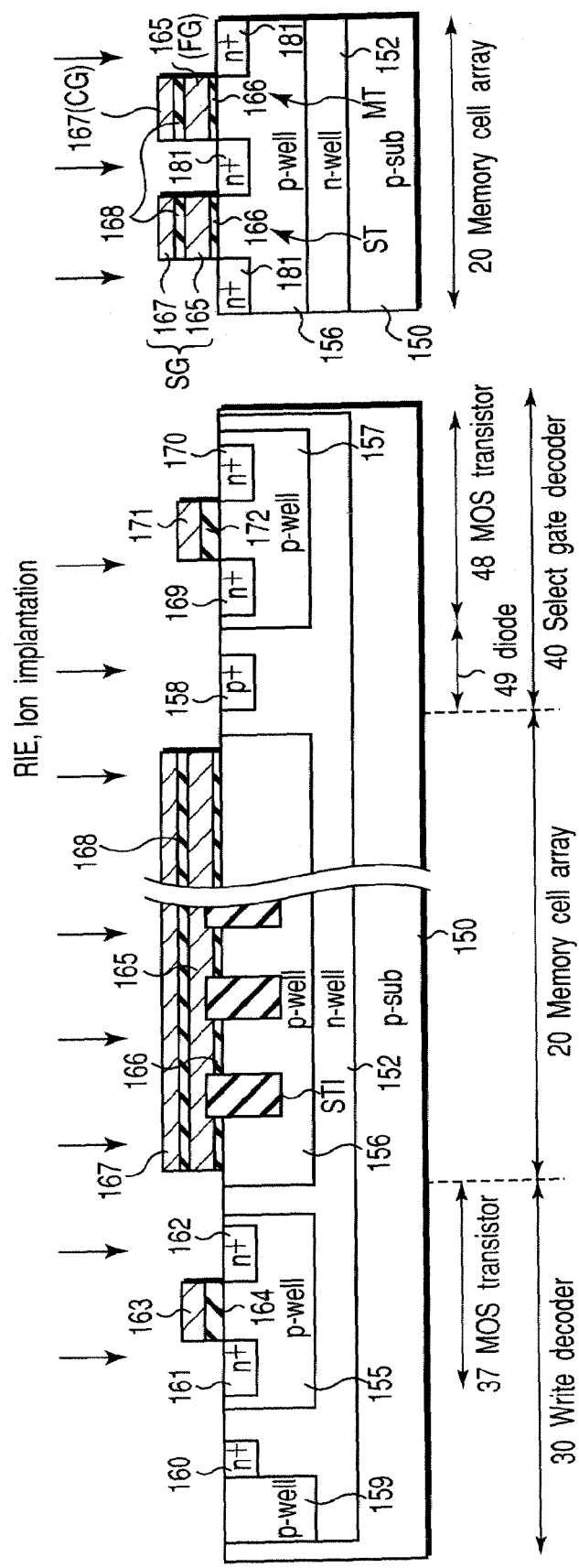

Next, as shown in FIG. 10, the polysilicon layer 167 and amorphous silicon layer 165 are patterned by photolithographic techniques and RIE, thereby forming the gate electrodes for the individual MOS transistors. In FIG. 10, a sectional view of the memory cell array 20 taken in the bit line direction is also shown.

Then, with the respective gate electrodes as masks, n-type impurities are ion-implanted into the surface regions of the p-well regions 155, 156, 157. The introduced impurities are activated by heat treatment, thereby forming $n^+$-type impurity diffused layers 161, 162, 169, 170, 181 functioning as sources or drains. At this time, n-type impurities are also introduced into the surface region of the n-well region 152 in such a manner that the impurities come into contact with the p-well region 159, with the result that an $n^+$-type impurity diffused layers 160 is formed.

Figure 11:
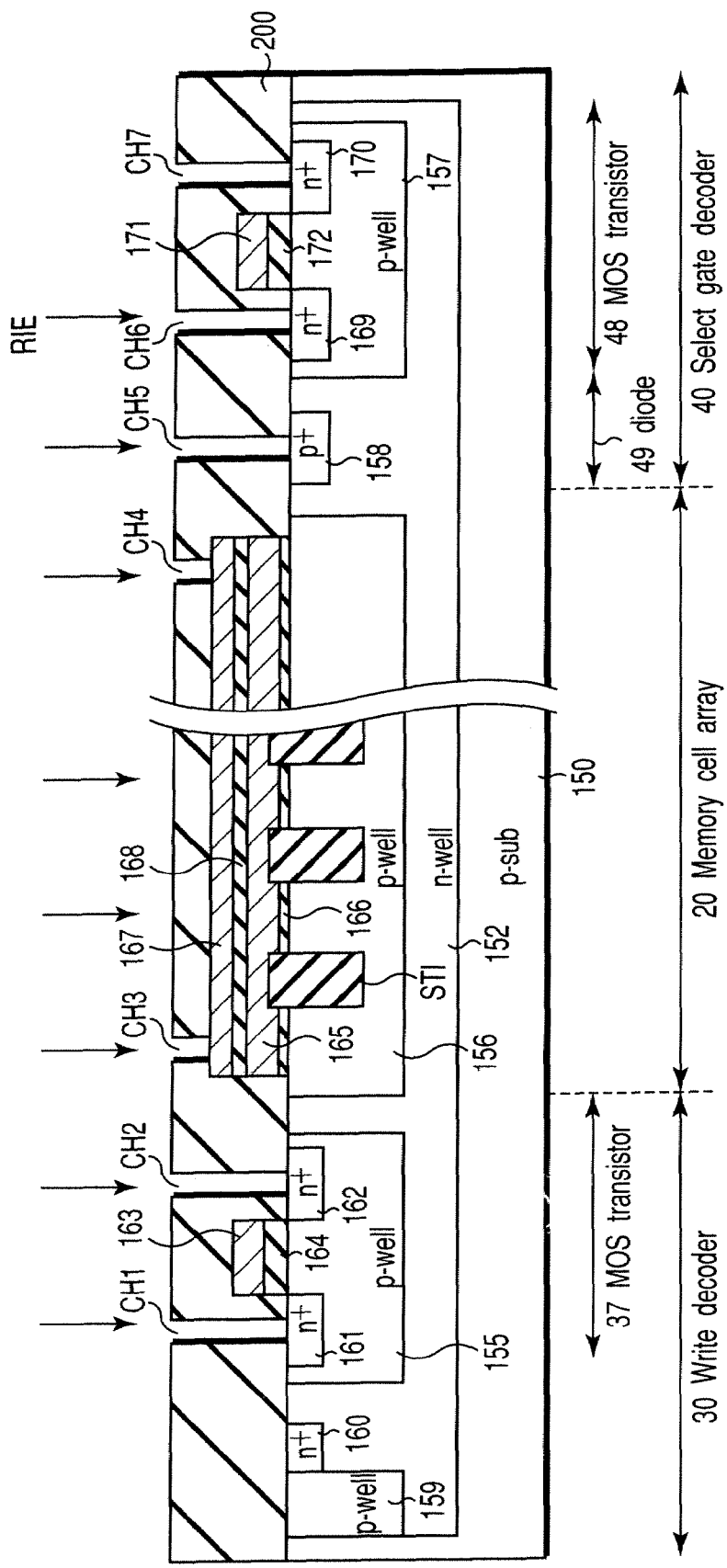

Next, as shown in FIG. 11, an interlayer insulating film 200 is formed on the silicon substrate 150 by, for example, CVD techniques so as to cover the MOS transistors 37, 48 and memory cell MC. The interlayer insulating film 200 is made of, for example, BPSG (Boron Phosphorous Silicate Glass) film. Then, using photolithographic techniques and RIE, contact holes CH1 to CH7 are made in the interlayer insulating film 200. The bottoms of the contact holes CH1 to CH7 reach the n⁺-type impurity diffused layers 161, 162, 169, 170, respectively. The bottom of the contact hole CH5 reaches the p⁺-type impurity diffused layer 158. Furthermore, the contact holes CH3, CH4 reach one end (the write decoder 37 side) and the other end (the select gate decoder 40 side) of the select gate line 167, respectively.

Figure 12:
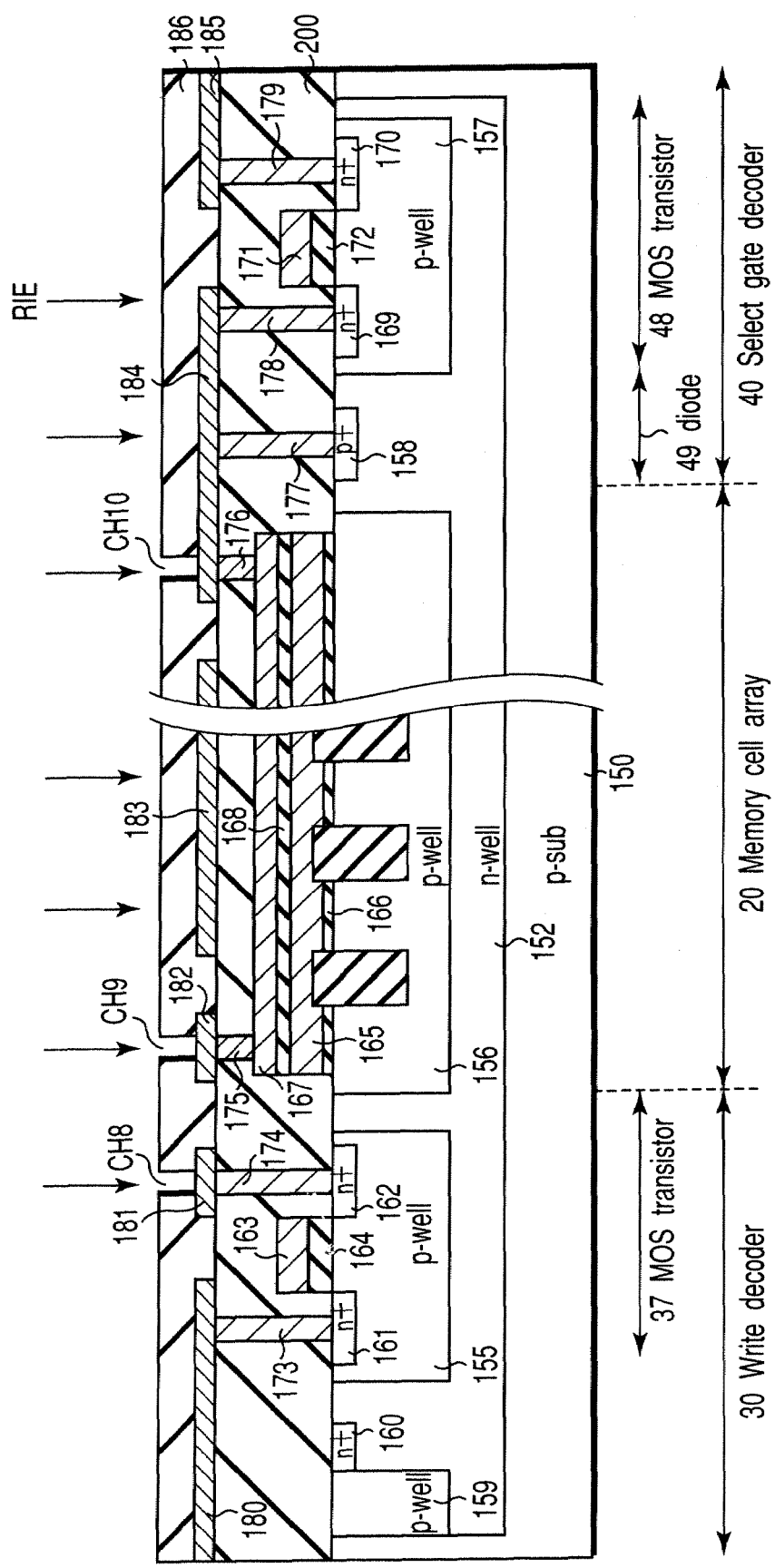

Next, as shown in FIG. 12, the contact holes CH1 to CH7 are filled with, for example, a polysilicon layer or a metal layer of, for example, tungsten, by CVD techniques or sputtering techniques, thereby forming contact plugs 173 to 179. Then, a metal layer of, for example, copper or aluminum is formed on the interlayer insulating film 200 by CVD techniques or sputtering techniques. Then, the metal layer is patterned into a specific pattern, thereby forming metal wiring layers 180 to 185. Thereafter, an interlayer insulating film 186 is formed on the interlayer insulating film 200. Then, using photolithographic techniques and RIE, contact holes CH8 to CH10 are made in the interlayer insulating film 186. The bottoms of the contact holes CH8 to CH10 reach the metal wiring layers 181, 182, 184, respectively.

Next, as shown in FIG. 13, the contact holes CH8 to CH10 are filled with, for example, a polysilicon layer or a metal layer of, for example, tungsten, by CVD techniques or sputtering techniques, thereby forming contact plugs 187 to 189. Then, a metal layer of, for example, copper or aluminum is formed on the interlayer insulating film 186 by CVD techniques or sputtering techniques. Then, the metal layer is patterned into a specific pattern, thereby forming metal wiring layers 190 to 193. Thereafter, an interlayer insulating film 194 is formed on the interlayer insulating film 186. Then, using photolithographic techniques and RIE, contact holes CH11 to CH13 are made in the interlayer insulating film 194. The bottoms of the contact holes CH11 to CH13 reach the metal wiring layers 190, 191, 193, respectively.

Thereafter, the contact holes CH11 to CH13 are filled with a conductive layer, thereby forming a metal wiring layer (a shunt wire for the select gate line) 198 which connects the contact holes to one another. Then, an interlayer insulating film 199 is formed on the interlayer insulating film 194, thereby producing the structure shown in FIG. 6.

Figure 14:
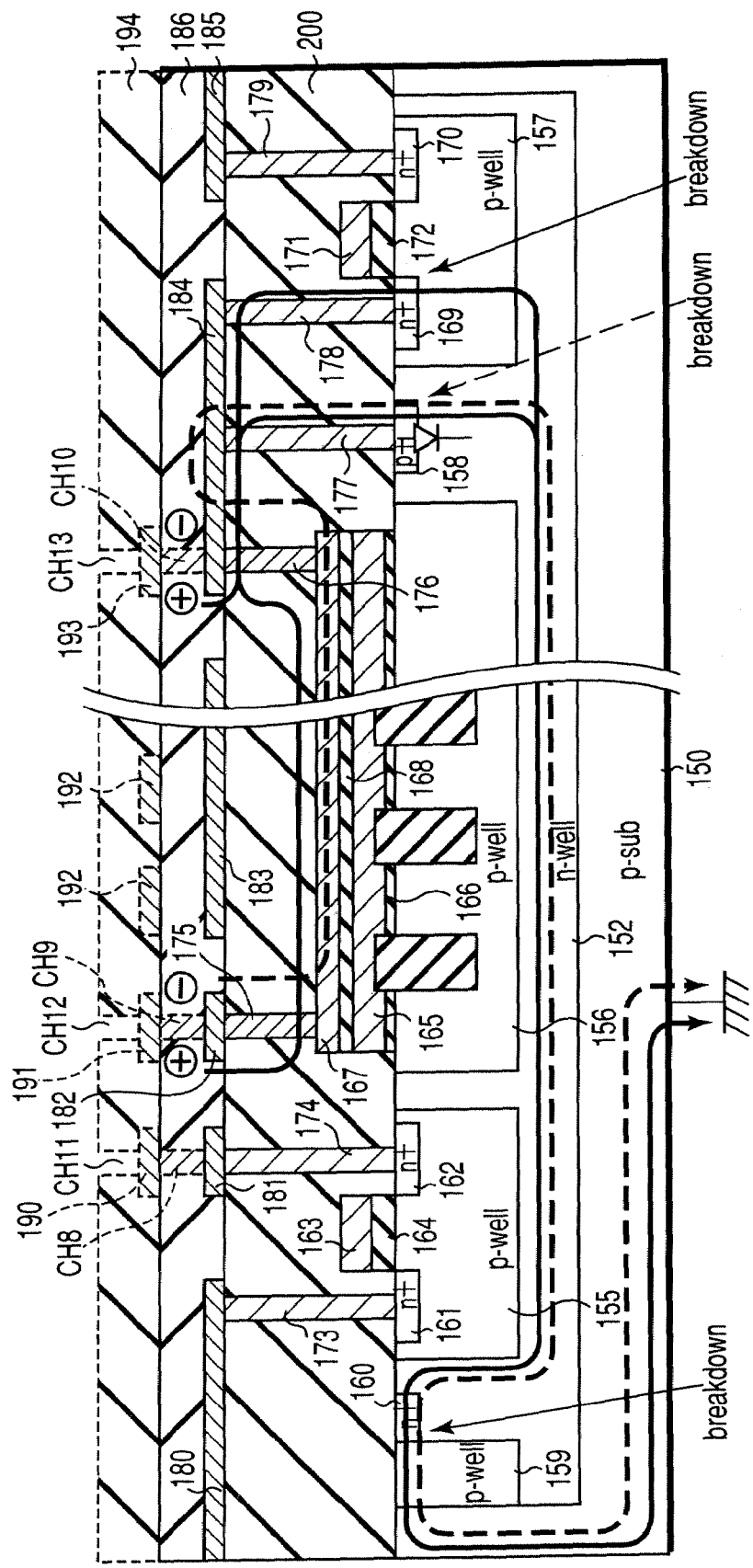
FIG. 14 is a sectional view of a part of the memory cell array, select gate decoder, and write decoder included in the flash memory of the first embodiment.

As described above, with the flash memory according to the first embodiment, plasma damage to the flash memory can be reduced. This effect will be explained in detail below. FIG. 14, which is a sectional view of a flash memory according to the first embodiment, shows the processes of making the contact holes CH8 to CH10 or the contact holes CH11 to CH13, centering on the same region as in FIG. 6.

In the process of manufacturing a flash memory, RIE and plasma CVD are used. In this case, the flash memory is exposed to plasma, with the result that charges accumulate at the surface of the chip. Then, the charges might destroy the semiconductor elements. Particularly in a memory cell whose gate insulating film is thin and which must guarantee more than a hundred thousand rewrites, the damage is serious. For example, when the contact holes CH8 to CH10, CH12, CH13 are made by RIE, when the metal wiring layers 182, 184, 191, 193, 198 are patterned by RIE, or when the interlayer insulating films 186, 194, 199 are formed, positive or negative charges accumulate at the surface as shown in FIG. 14. When the amount of charges becomes large, current will flow into the semiconductor substrate 150 via the thin gate insulating film 166 of the select transistor ST, which might destroy the select transistor ST.

However, with the structure according to the first embodiment, there is provided a path that allows positive and negative charges to escape to the semiconductor substrate 150. Therefore, this prevents the charges from flowing via the gate insulating film 166 of the memory cell. The path will be explained below.

In the structure of the first embodiment, the p⁺-type impurity diffused layer 158 is formed at the surface of the n-well region 152. Then, the p⁺-type impurity diffused layer 158 is connected to the select gate line via the contact plug 177, metal wiring layer 184, and contact plug 176. This path makes a path that allows positive and negative charges to escape. Furthermore, a path from the metal wiring layer 184 to the contact plug 178, n⁺-type impurity diffused layer 169, and p-well region 157, and to the n-well region 152 makes a path that allows positive charges to escape.

For example, suppose negative charges are accumulated in the metal wiring layer 184. Then, the negative charges flow into the p⁺-type impurity diffused layer 158 via the metal wiring layer 184 and contact plug 177. Since the p⁺-type impurity diffused layer 158 and n-well region 152 form the diode 49, the diode 49 is reverse-biased. Then, the diode 49 is broken down, with the result that the negative charges flow into the n-well region 152. Then, the negative charges flow into the n⁺-type impurity diffused layer 160. Since the p-n junction of the n⁺-type impurity diffused layer 160 and p-well region 159 forms a diode, the diode is forward-biased. As a result, the negative charges flow into the p-well region 159 and further into the p-type semiconductor substrate 150 set to the ground potential.

The same holds true when negative charges are accumulated in the metal wiring layer 193. Specifically, charges flow into the metal wiring layer 184 via the contact plug 197. From this point on, the explanation continues as described above.

In addition, the negative charges accumulated in the metal wiring layers 191, 182 flow into the metal wiring layer 184 via the select gate line 167 and contact plug 176. Form this point on, the explanation continues as described above.

Next, a case where positive charges are accumulated will be explained. Suppose positive charges are accumulated in the metal wiring layer 184. Then, the positive charges flow into the p⁺-type impurity diffused layer 158 via the metal wiring layer 184 and contact plug 177. This makes the diode 49 forward-biased. As a result, the negative charges flow into the n-well region 152. The positive charges accumulated in the metal wiring layer 184 flow into the n⁺-type impurity diffused layer 169 via the contact plug 178. Then, the p-n junction of the n⁺-type impurity diffused layer 169 and p-well region 157 is reverse-biased. Then, the p-n junction is broken down, with the result that the positive charges flow into the p-well region 157 and further into the n-well region 152 via the p-n junction (forward-biased) of the p-well region 157 and n-well region 152. The positive charges flowed into the n-well region 152 flow into the n⁺-type impurity diffused layer 160. Then, the diode made up of the n⁺-type impurity diffused layer 160 and p-well region 159 is reverse-biased, with the result that the diode is broken down. As a result, the positive charges flow into the p-type semiconductor substrate 150 set to the ground potential.

The same holds true when positive charges are accumulated in the metal wiring layer 193. Specifically, charges flow into the metal wiring layer 184 via the contact plug 197. From this point on, the explanation continues as described above.

In addition, the positive charges accumulated in the metal wiring layers 191, 182 flow into the metal wiring layer 184 via the select gate line 167 and contact plug 176. Form this point on, the explanation continues as described above.

As described above, when charges are accumulated in the region connected to the select gate line 167, a path to allow the charges to escape to the semiconductor substrate 150 is provided, regardless of whether they are positive charges or negative charges. Thus, this suppresses the flowing of the charges via the gate insulating film, which prevents the breakdown of the gate insulating film.

The first embodiment is particularly effective in a case where a memory cell includes two MOS transistors, a memory cell transistor MT and a select transistor ST. In such a flash memory, a select gate line SG is sandwiched between two MOS transistors 37, 48. This is because the select gate line SG has to be separated from the select gate decoder 40 in order that the write decoder 30 applies a voltage to the select gate line SG in a write operation and because the select gate line SG has to be separated from the write decoder 30 in order that the select gate decoder 40 applies a voltage to the select gate line SG in a read operation.

In this case, the isolation MOS transistors 37, 48 are of the same conductivity type. In the example of FIG. 13, each of them is formed so as to have an n channel. If the diode 49 is not provided, a problem arises in escaping negative charges. When the diode 49 is not used, negative charges are allowed to escape to the semiconductor substrate 150 via the MOS transistor 48. More specifically, negative charges are allowed to escape to the p-type semiconductor substrate 150 by way of the metal wiring layer 184, contact plug 178, $n^+$-type impurity diffused layer 169, p-well region 157, n-well region 152, $n^+$-type impurity diffused layer 160, and p-well region 159 in that order. Then, since the p-n junction of the p-well region 157 and n-well region 152 is reverse-biased, the positive charges flow into the n-well region 152 as a result of the breakdown of the p-n junction. The n-well region 152, which serves as the back gate of the MOS transistor 48, has a relatively low impurity concentration. Therefore, a relatively high voltage is required to break down the p-n junction formed by the p-well region 157 and n-well region 152. When charges have accumulated to the voltage at which the p-n junction breaks down, the gate insulating film 166 of the memory cell might break down instead. The above path is very unreliable in escaping the negative charges.

However, with the configuration of the first embodiment, the diode 49 is formed and the $p^+$-type impurity diffused layer 158 serving as the anode has a higher impurity concentration than that of the p-well region 157. That is, the voltage at which the diode 49 breaks down is lower than the voltage necessary for the p-n junction formed by the p-well region 157 and n-well region 152 to break down. Therefore, the diode 49 breaks down before the breakdown of the gate insulating film 166 takes place, with the result that the negative charges are allowed to escape to the semiconductor substrate 150. Accordingly, plasma damage to the memory cell MC can be avoided.

Figure 15:
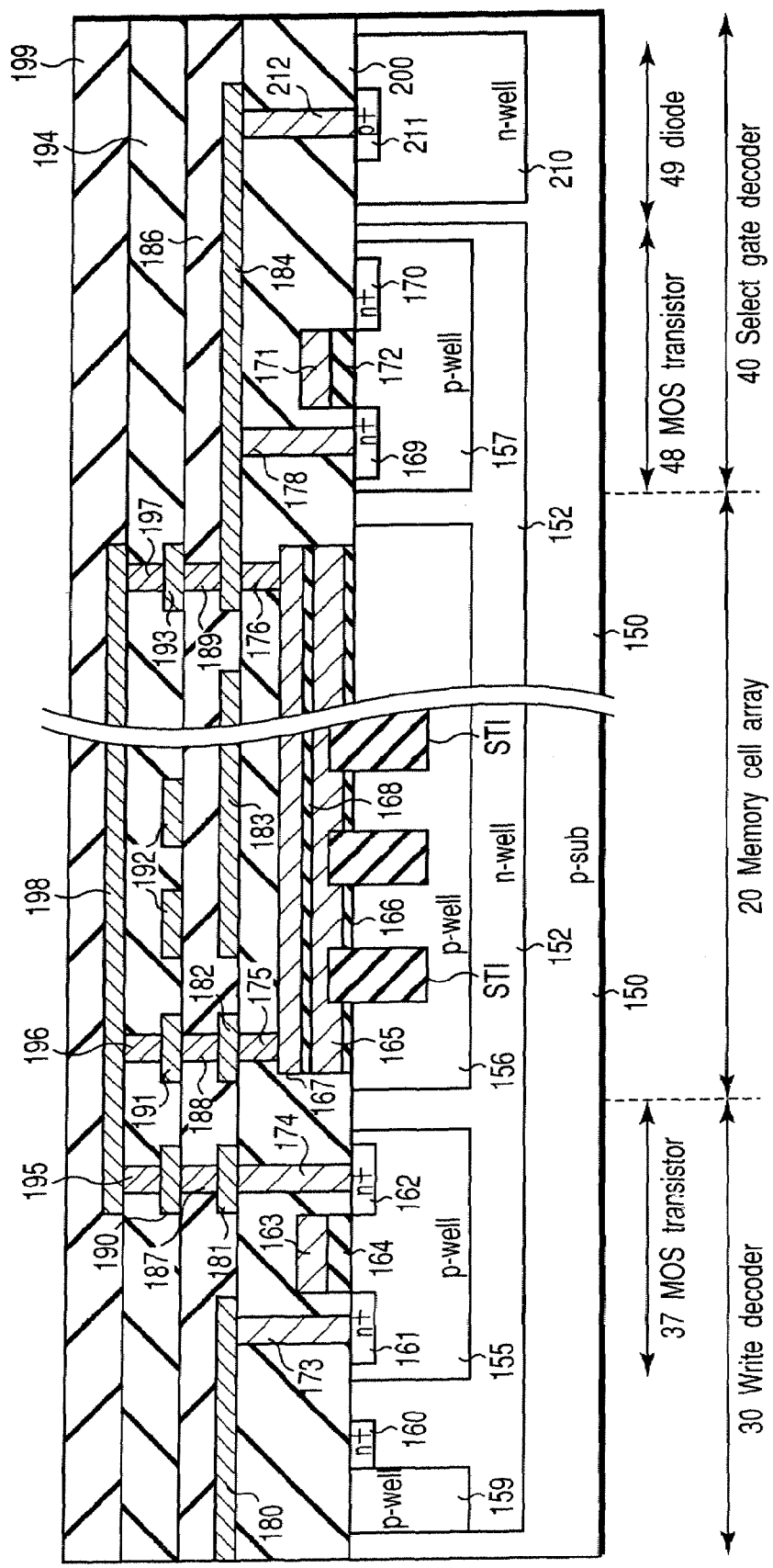
FIG. 15 is a sectional view of a part of the memory cell array, select gate decoder, and write decoder included in a flash memory according to a second embodiment of the present invention.

Hereinafter, a semiconductor memory device according to a second embodiment of the present invention will be explained. The nonvolatile semiconductor memory device of the second embodiment is such that the diode 49 is formed outside the n-well region 152 in the structure explained in FIG. 6 of the first embodiment. FIG. 15 is a sectional view of a flash memory according to the second embodiment, showing a region corresponding to FIG. 6 explained in the first embodiment.

As shown in FIG. 15, the configuration of the second embodiment is such that the $p^+$-type impurity diffused layer 158 and contact plug 177 are eliminated from the configuration of FIG. 6 explained in the first embodiment. Then, an n-well region 210 is formed in the surface region of the semiconductor substrate 150, so as to be separated from the n-well region 152. Moreover, a $p^+$-type impurity diffused layer 211 is formed in the surface region of the n-well region 210. The $p^+$-type impurity diffused layer 211 has a higher impurity concentration than that of the p-well regions 155 to 157. The p-n junction of the $p^+$-type impurity diffused layer 211 and n-well region 210 forms the diode 49. That is, the $p^+$-type impurity diffused layer 211 and n-well region 210 function as the anode and cathode of the diode, respectively. Then, a contact plug 212 is formed on the $p^+$-type impurity diffused layer 211. The contact plugs 176, 178, 212 are connected commonly to the metal wiring layer 184. The remaining configuration is the same as that of the first embodiment, so its explanation will be omitted. A flash memory manufacturing method according to the second embodiment is the same as that of the first embodiment. The n-well region 210 is formed at the same time when the n-well region 152 is formed. The operation of the second embodiment is the same as explained in the first embodiment.

Figure 16:
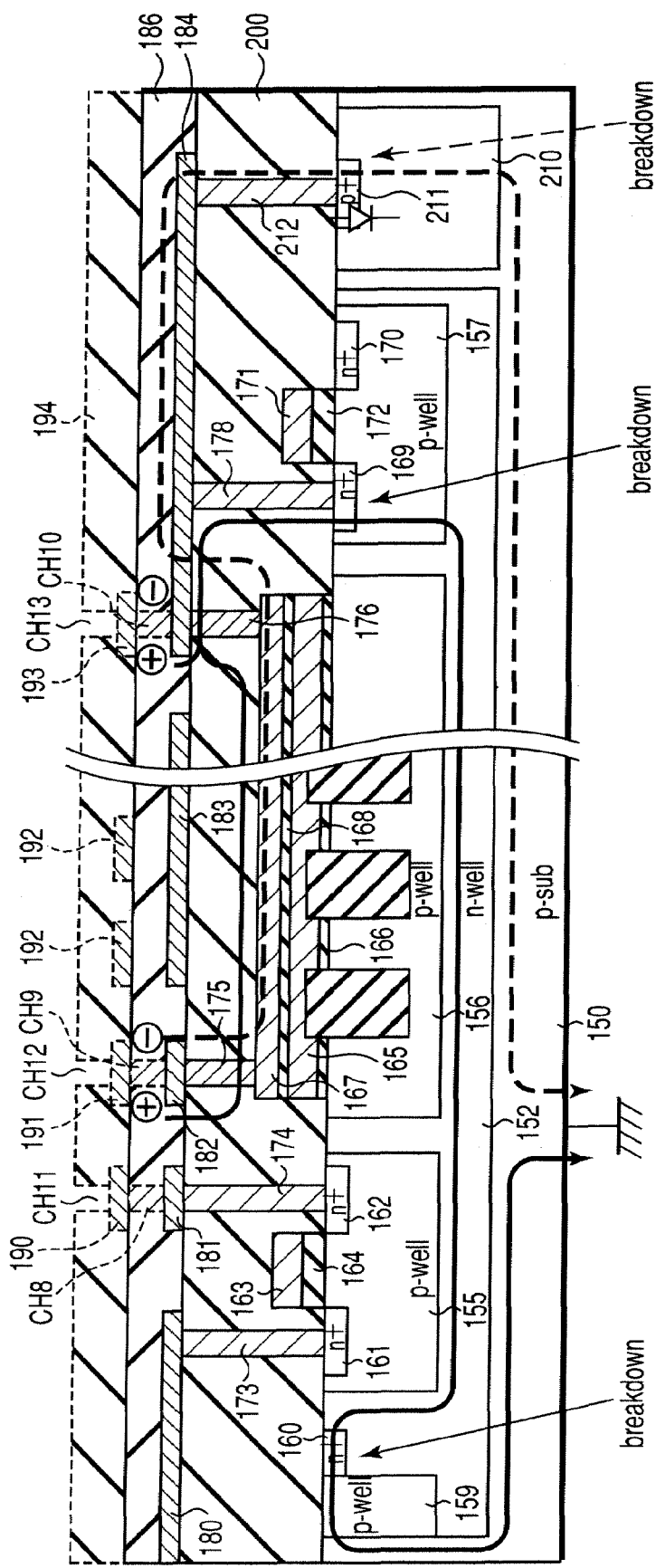
FIG. 16 is a sectional view of a part of the memory cell array, select gate decoder, and write decoder included in a flash memory according to the second embodiment.

As in the first embodiment, a flash memory in the second embodiment makes it possible to reduce plasma damage to the flash memory. This will be explained by reference to FIG. 16. FIG. 16 is a sectional view of a flash memory according to the second embodiment.

In the structure of the second embodiment, negative charges are allowed to escape to the semiconductor substrate 150 by way of the path from the metal wiring layer 184 to the contact plug 212, p+-type impurity diffused layer 211, and n-well region 210, and to the p-type semiconductor substrate 150 in that order. As in the first embodiment, positive charges are allowed to escape to the semiconductor substrate 150 by way of the path from the metal wiring layer 184 to the contact plug 178, $n^+$-type impurity diffused layer 169, p-well region 157, n-well region 152, and n+-type impurity diffused layer 160, and to the p-type semiconductor substrate 159 in that order.

Since the way of escaping positive charges is the same as that in the first embodiment, the explanation below will be given, centering only on negative charges. For example, suppose negative charges are accumulated in the metal wiring layer 184. Then, the negative charges flow into the $p^+$-type impurity diffused layer 211 via the metal wiring layer 184 and contact plug 212. Since the $p^+$-type impurity diffused layer 211 and n-well region 210 form the diode 49, the diode 49 is reverse-biased. As a result, the diode 49 is broken down, which allows the negative charges to flow into the n-well region 210. Then, the p-n junction formed by the n-well region 210 and the p-type semiconductor substrate 150 is forward-biased, which permits the negative charges to flow into the p-type semiconductor substrate 150 set at to the ground potential.

The same holds true when negative charges are accumulated in the metal wiring layer 193. That is, charges flow into the metal wiring layer 184 via the contact plug 197. From this point on, the explanation goes on as described above.

In addition, the negative charges accumulated in the metal wiring layers 191, 182 flow into the metal wiring layer 184 via the contact plug 176. From this point on, the explanation goes on as described above.

As described above, the configuration of the second embodiment produces the same effect as that of the first embodiment. In the configuration of the second embodiment, the diode 49 is formed outside the n-well region 210. Accordingly, in a read operation, the potential of the n-well region 152 can be controlled independently.

As described above, in the flash memory according to each of the first and second embodiments, there is provided a path that allows charges produced in the manufacturing processes, particularly charges accumulated in the regions connected to the select gates of the memory cells, to escape to the semiconductor substrate. Of the p-n junctions included in the path, the breakdown voltages of the ones reverse-biased are made lower than those of the gate insulating films of the memory cells. As a result, before the gate insulating film of the memory cell is broken down by charges, the charges are escaped to the semiconductor substrate, which prevents plasma damage to the memory cells.

It is desirable that the metal wiring layer 184 connected to the diode 49 should be located in the lowest position of the multilayer wiring lines, particularly in the lowest layers of the metal wiring lines connected to the select gate lines. The reason is that, if the metal wiring layer 184 were in the second or higher layer of the multilayer wiring lines, charges produced in forming a metal wiring line in a lower layer than the metal wiring layer 184 could not be escaped to the semiconductor substrate.

In the first and second embodiments, the bit lines have been hierarchized into the global bit lines and local bit lines. It goes without saying that the embodiments may be applied to a case where the bit lines are not hierarchized. When the bit lines are hierarchized, the parasitic capacitances on the write global bit lines and read global bit lines are reduced, which improves the operating speed of the flash memory. In addition, the occurrence of erroneous writing into the memory cells connected to the unselected local bit lines is prevented effectively, which improves the reliability of the write operation.

Figure 17:
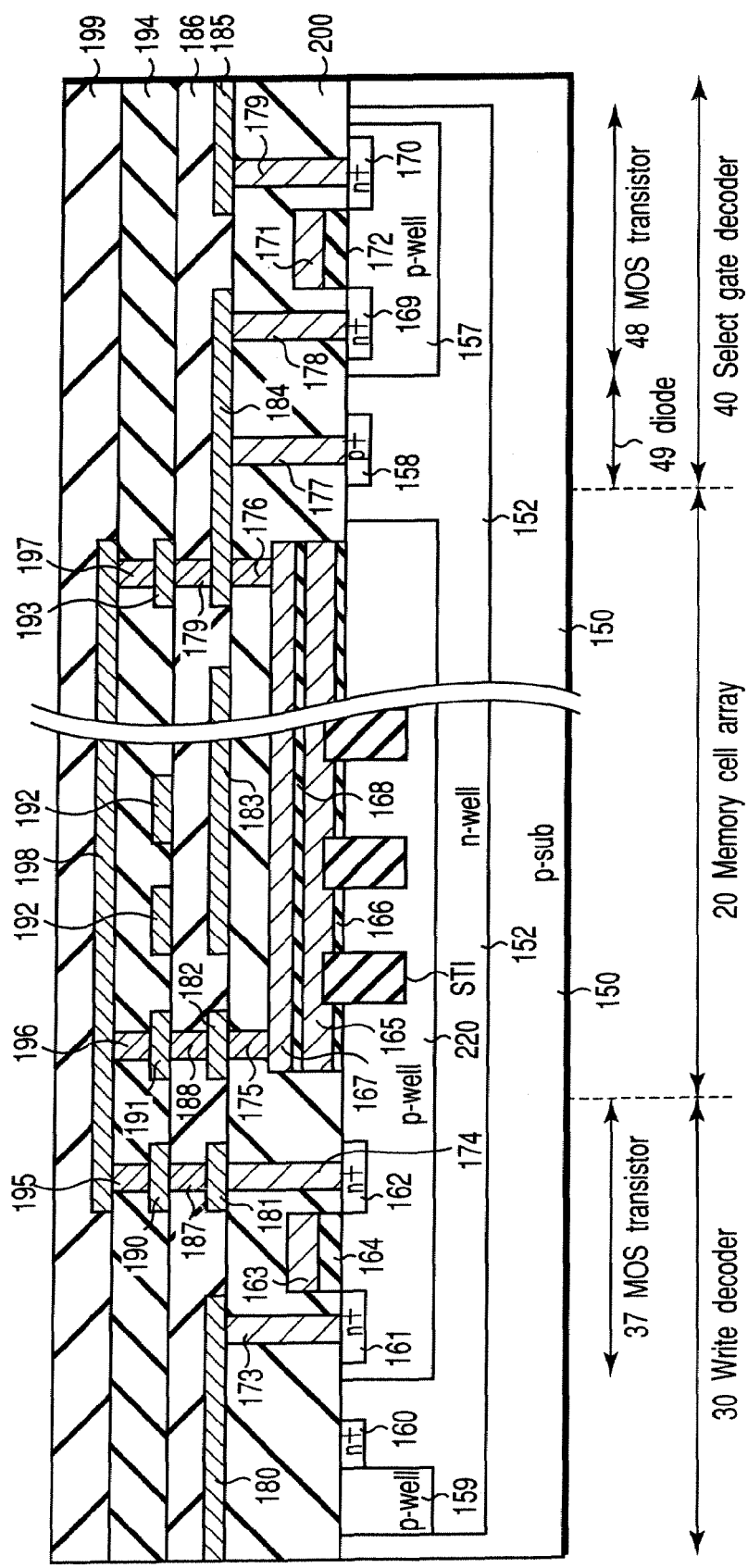
FIG. 17 is a sectional view of a part of the memory cell array, select gate decoder, and write decoder included in a flash memory according to a first modification of each of the first and second embodiments.
Figure 18:
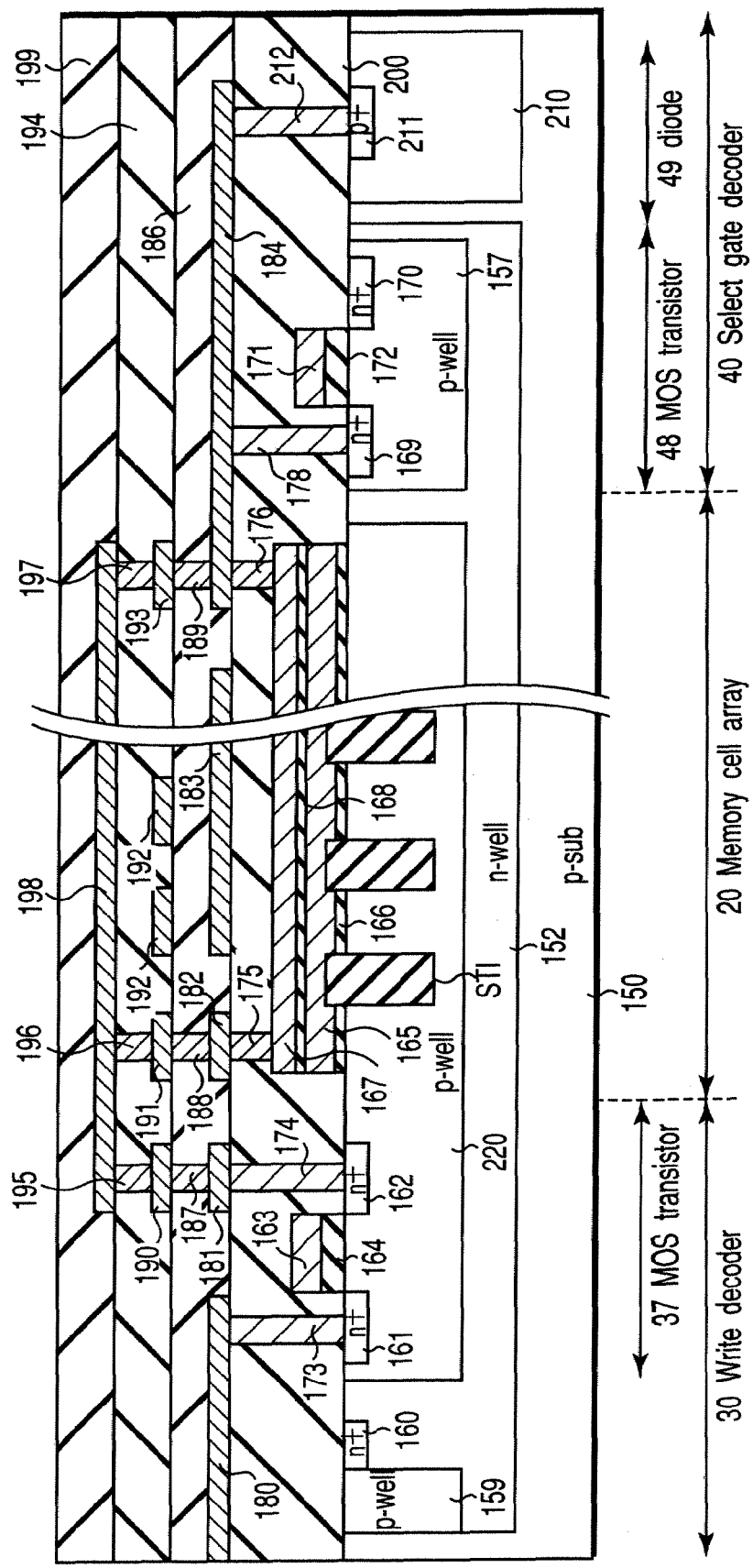
FIG. 18 is a sectional view of a part of the memory cell array, select gate decoder, and write decoder included in a flash memory according to the first modification of each of the first and second embodiments.

FIGS. 17 and 18 are sectional views of a flash memory according to a first modification of the first and second embodiments, respectively. The first modification is such that the switch element group 32 in the write decoder 30 and the memory cell array 20 are formed on the same well region. As shown in the figures, the memory cells MC and the MOS transistors 37 in the switch element group 32 are formed on the p-well region 220 formed at the surface of the n-well region 152. As a result, the back gate bias of the MOS transistor 37 is at the same potential as the potential VPW of the p-well region 220. With the first modification, the number of well regions is reduced, which simplifies the manufacturing processes. The path to supply a potential to the select gate lines SG0 to SG(4m−1) can also be used as the path to supply a potential to the p-well region 220. Accordingly, the switch element 143 and the path connecting the path from the control circuit 100 to the p-well region 156 with the switch element 143 are not needed. This makes the circuit configuration simpler, which simplifies the manufacturing processes. As a result, the manufacturing cost of the flash memory can be reduced.

Figure 19:
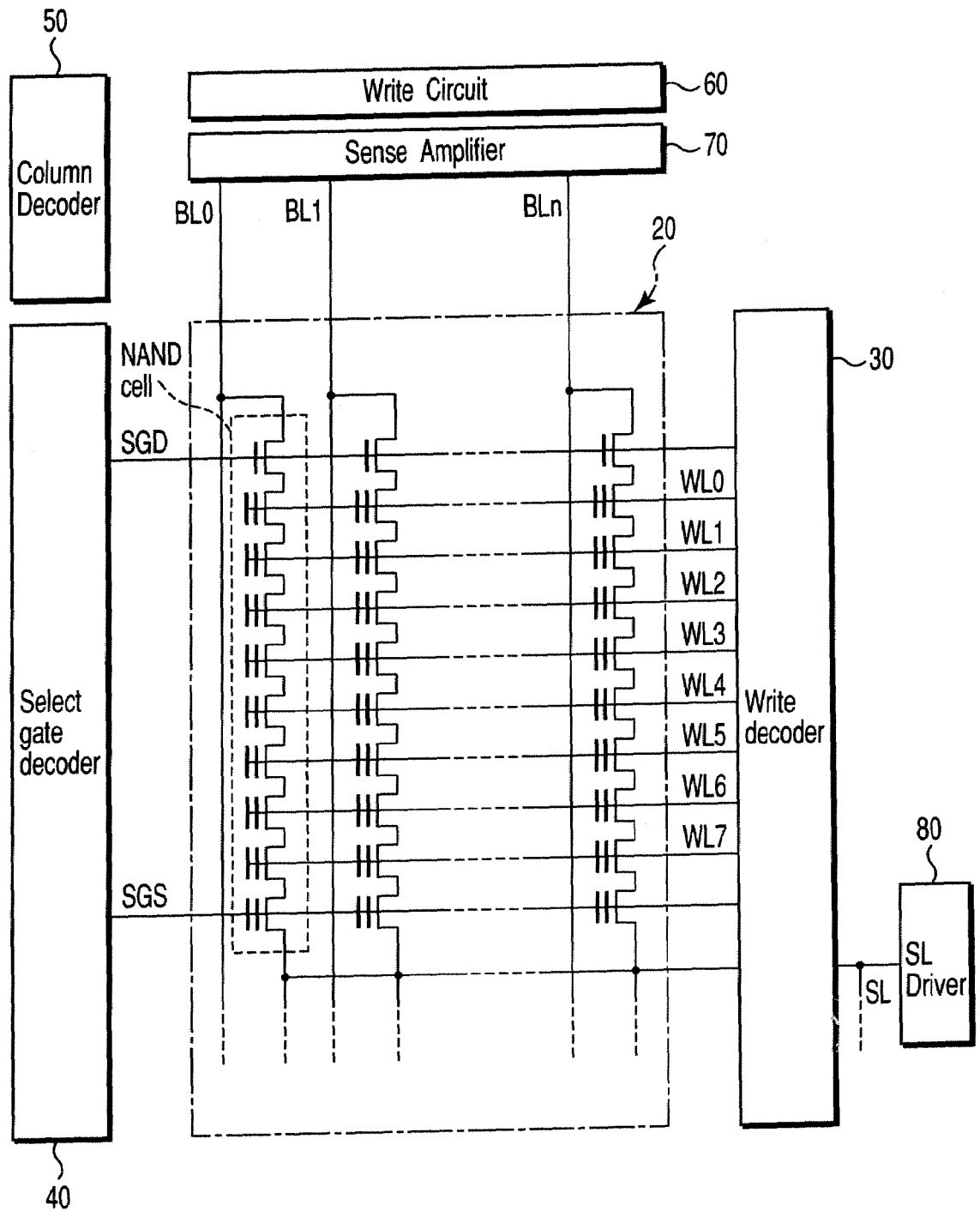
FIG. 19 is a block diagram of a flash memory according to a second modification of each of the first and second embodiments.

In the first and second embodiments, the flash memory have memory cells, each including two transistors, a select transistor ST and a memory cell transistor MT. The first and second embodiments may be further applied to a NAND flash memory. FIG. 19 is a block diagram of a flash memory according to a second modification of each of the first and second embodiments. FIG. 19 shows a NAND flash memory.

AS shown in FIG. 19, the memory cell array has a plurality of NAND cells. A NAND cell has two select transistors ST1, ST2 and a plurality of memory cell transistors MTs. FIG. 19 shows a case where eight memory cell transistors are used in a NAND cell. The number of memory cell transistors is not limited and may be 16 or 32. The plurality of memory cell transistors are connected in series between the source of the select transistor ST1 and the drain of the select transistor ST2. The drain regions of the select transistors ST1 in a same column are connected commonly to a bit line. The source regions of the select transistors ST2 are connected commonly a source line. Each of the memory cell transistors MT and select transistors ST1, ST2 has a stacked gate formed on the semiconductor substrate with a gate insulating film interposed therebetween. The stacked gate includes a floating gate formed on the gate insulating film and a control gate formed on the floating gate with an inter-gate insulating film interposed therebetween. In the memory cell transistor MT, the floating gates are separated on a transistor basis. In the select transistors ST1, ST2, the floating gates adjoining in the word line direction are connected to each other. Moreover, in the select transistors ST1, ST2, the floating gate and the control gate are connected electrically. The control gates of the memory cell transistors MT in a same row are connected commonly to a word line. The control gates of the select transistors ST1 in a same row are connected commonly to the select gate line SGD and the control gates of the select transistors ST2 are connected to the select gate line SGS. The remaining configuration is the same as that of each of the first and second embodiments.

The first and second embodiments can be applied even to the above NAND flash memory.

Furthermore, the embodiments may be applied to a flash memory having memory cells, each including two selects ST1, ST2 and one memory cell transistor MT. FIG. 20 is a block diagram of a flash memory according to a third modification of each of the first and second embodiments.

As shown in FIG. 20, the memory cell 20 has a plurality of memory cells MCs arranged in a matrix. A memory cell has two select transistors ST1, ST2 and one memory cell transistor MT. The three transistors are connected in series in such a manner that the memory cell transistor MT is sandwiched between the two select transistors ST1, ST2. The drain regions of the select transistors ST1 in a same column are connected commonly to a bit line. The source regions of the select transistors are connected commonly to a source line. Each of the memory cell transistors MT and select transistors ST1, ST2 has a stacked gate formed on the semiconductor substrate with a gate insulating film interposed therebetween. The stacked gate includes a floating gate formed on the gate insulating film and a control gate formed on the floating gate with an inter-gate insulating film interposed therebetween. In the memory cell transistor MT, the floating gates are separated on a transistor basis. In the select transistors ST1, ST2, the floating gates adjoining in the word line direction are connected to each other. Moreover, in the select transistors ST1, ST2, the floating gate and the control gate are connected electrically. The control gates of the memory cell transistors MT in a same row are connected commonly to a word line. The control gates of the select transistors ST1 in a same row are connected commonly to the select gate line SGD and the control gates of the select transistors ST2 are connected commonly to the select gate line SGS. The remaining configuration is the same as that of each of the first and second embodiments.

The first and second embodiments can be applied even to the above flash memory.

Figure 21:
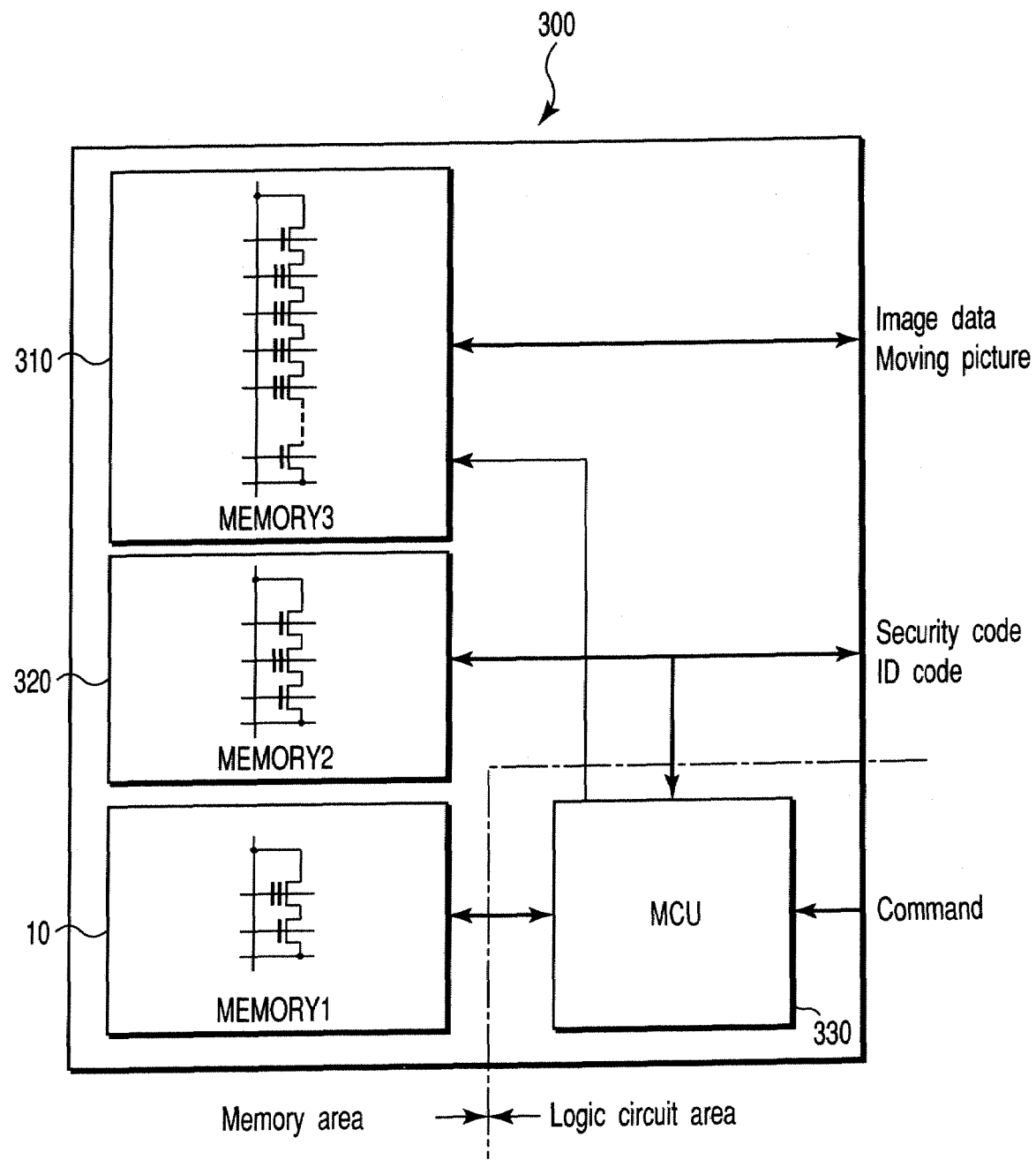
FIG. 21 is a block diagram of a system LSI including a flash memory according to a fourth modification of each of the first and second embodiments.

Furthermore, the embodiments may be applied to a system LSI. FIG. 21 is a block diagram of a system LSI including a flash memory according to a fourth modification of each of the first and second embodiments.

As shown in FIG. 21, a system LSI 300 has a logic circuit area and a memory area. In the logic circuit area, for example, a CPU 330 is provided. In the memory area, there are provided a flash memory 10 explained in the first and second embodiments, a flash memory 320 including three MOS transistors explained in FIG. 20, and a NAND flash memory 310 explained in FIG. 19. Each of the memory cells in the flash memory 10 has two transistors connected in series, which provides a higher current driving capability than that of another type of memory cell. Therefore, the flash memory 10 is suitable for high-speed reading. As shown in FIG. 21, when the flash memory 10 is embedded to the same chip as the MCU 330, the flash memory 10 can be used as a ROM for storing firmware or the like for the MCU 330. Since the operating speed of the flash memory 10 is fast, the MCU 330 can read data directly without using a RAM or the like, which makes a RAM unnecessary and therefore improves the operating speed of the system LSI. The flash memory 10 can be formed in the same manufacturing processes as those of the flash memory 320 and NAND flash memory 310. For example, the ion implantation process for forming impurity diffused layers and the process of patterning gate electrodes and metal wiring layers can be carried out for the three types of flash memories at the same time. In this case, for example, the impurity diffused layers have the same concentration between the individual memories. As described above, since the three flash memories provided in an LSI can be formed in the same processes, the LSI manufacture can be simplified.

Furthermore, for example, the MCU 330 may be formed on an SOI substrate in the logic circuit area, and each of the memories 10, 310, and 320 may be formed on a bulk silicon substrate in the memory area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a first to a fourth semiconductor layer of a first conductivity type which are formed in a surface region of a fifth semiconductor layer of a second conductivity type in such a manner that they are isolated from one another;
memory cells each of which includes a first MOS transistor of the second conductivity type formed on the first semiconductor layer;
a second and a third MOS transistor of the second conductivity type which are formed on the second and third semiconductor layers, respectively;
a metal wiring layer which connects the gate of the first MOS transistor to the source or drain of at least one of the second and third MOS transistors; and
a contact plug which connects the fourth semiconductor layer to the metal wiring layer.

2. A semiconductor memory device comprising:
a first semiconductor layer of a first conductivity;
a second semiconductor layer of a second conductivity which is formed in a surface region of the first semiconductor layer;
a memory cell which includes a first MOS transistor formed on the second semiconductor layer;
a select gate line connected to a gate of the first MOS transistor; and
a diode which has an anode connected to the select gate line and a cathode connected to the first semiconductor layer.

3. The device according to claim 2,
wherein the select gate line is metal wiring layer which is in the lowest layer of the metal wiring lines connected to the gate of the first MOS transistor.

4. The device according to claim 2, further comprising:
a third semiconductor layer of the second conductivity formed in the surface region of the first semiconductor layer,
wherein a junction of the first and third semiconductor layer forms the diode.

5. The device according to claim 2,
wherein the gate of the first MOS transistor includes a first gate electrode formed on the second semiconductor layer with a first gate insulating film interposed therebetween and a second gate electrode formed on the first gate electrode with a first inter-gate insulating film interposed therebetween,
the first and second gate electrodes are connected to the select gate line.

6. The device according to claim 5,
wherein the memory cell further includes a second MOS transistor formed on the second semiconductor layer,
the second MOS transistor includes a source connected to a drain of the first MOS transistor and a stacked gate including a floating gate formed on the second semiconductor layer with a second gate insulating film interposed therebetween and a control gate formed on the floating gate with a second inter-gate insulating film interposed therebetween.

7. The device according to claim 2, further comprising:
a third semiconductor layer of the second conductivity which is formed in the surface region of the first semiconductor layer;
a row decoder which selects the select gate line in a read operation; and
a second MOS transistor formed on the third semiconductor layer, the second MOS transistor connecting the select gate line to the row decoder.

* * * * *